(12) United States Patent
Consoli

(10) Patent No.: US 11,063,391 B2
(45) Date of Patent: Jul. 13, 2021

(54) CIRCUIT CARD ASSEMBLIES FOR A COMMUNICATION SYSTEM

(71) Applicant: TE CONNECTIVITY SERVICES GmbH, Schaffhausen (CH)

(72) Inventor: John Joseph Consoli, Harrisburg, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 16/600,267

(22) Filed: Oct. 11, 2019

(65) Prior Publication Data

US 2021/0111515 A1   Apr. 15, 2021

(51) Int. Cl.
*H01R 13/629* (2006.01)
*H01R 12/71* (2011.01)
*H05K 1/18* (2006.01)

(52) U.S. Cl.
CPC ..... *H01R 13/62994* (2013.01); *H01R 12/716* (2013.01); *H05K 1/18* (2013.01); *H05K 2201/09163* (2013.01); *H05K 2201/10189* (2013.01)

(58) Field of Classification Search
CPC ........ H01R 13/62938; H01R 13/62955; H01R 13/633; H01R 13/6335; H01R 23/7005; H01R 13/62994; H01R 12/716; H05K 1/18; H05K 2201/10189; H05K 2201/09163
USPC .......................................... 439/157, 159, 160
See application file for complete search history.

(56) References Cited

U.S. PATENT DOCUMENTS

| | | | |
|---|---|---|---|
| 3,587,029 A | 6/1971 | Knowles et al. | |
| 4,560,221 A | 12/1985 | Olsson | |
| 5,114,353 A | 5/1992 | Sample | |
| 5,676,559 A | 10/1997 | Laub et al. | |
| 5,681,175 A * | 10/1997 | Busse .............. | H01R 13/62977 |
| | | | 439/157 |

(Continued)

FOREIGN PATENT DOCUMENTS

| | | |
|---|---|---|
| EP | 2346117 A2 | 7/2011 |
| EP | 24451262 A2 | 5/2012 |

(Continued)

OTHER PUBLICATIONS

U.S. Appl. No. 15/945,812, filed Apr. 5, 2018 (57 pages).

(Continued)

*Primary Examiner* — Gary F Paumen

(57) ABSTRACT

A communication system includes first and second circuit card assemblies each having a PCB and an electrical connector having a mating end and contacts. The first electrical connector has a receptacle housing and a mating housing received in the receptacle housing with cam levers therebetween. The second electrical connector has a header housing and driving elements interfacing with the cam levers to actuate the mating housing relative to the receptacle housing. The PCB includes a slot receiving the other PCB in a board loading direction and the header housing is coupled to the receptacle housing in the board loading direction to interface the driving elements with the cam levers. The mating housing is movable away from the second mating end to a preloaded position by the driving elements and is movable toward the second mating end to a mated position by the driving elements.

20 Claims, 15 Drawing Sheets

(56) References Cited

U.S. PATENT DOCUMENTS

| | | | |
|---|---|---|---|
| 5,924,880 A * | 7/1999 | Watanabe | H01R 13/62905 439/157 |
| 5,964,602 A * | 10/1999 | Aoki | H01R 13/62977 439/157 |
| 6,267,604 B1 | 7/2001 | Mickievicz et al. | |
| 6,540,546 B2 * | 4/2003 | Kubo | H01R 13/4361 439/157 |
| 6,796,822 B2 | 9/2004 | Sato et al. | |
| 6,918,775 B2 | 7/2005 | Korsunsky et al. | |
| 7,086,866 B1 | 8/2006 | Folan et al. | |
| 7,322,834 B2 | 1/2008 | Hu et al. | |
| 7,326,092 B2 | 2/2008 | Fedder et al. | |
| 7,354,274 B2 * | 4/2008 | Minich | H01R 12/714 439/61 |
| 7,435,095 B1 | 10/2008 | Yi | |
| 7,540,744 B1 | 6/2009 | Minich | |
| 7,708,578 B1 | 5/2010 | Lenox | |
| 7,771,207 B2 | 8/2010 | Hamner et al. | |
| 7,789,668 B1 | 9/2010 | Hamner et al. | |
| 7,824,187 B1 | 11/2010 | Yi | |
| 7,918,683 B1 | 4/2011 | Hamner et al. | |
| 7,988,457 B1 | 8/2011 | Morgan | |
| 8,113,851 B2 | 2/2012 | Hamner et al. | |
| 8,199,511 B2 | 6/2012 | Kim et al. | |
| 8,376,766 B1 | 2/2013 | Huettner et al. | |
| 8,512,081 B2 | 8/2013 | Stokoe | |
| 8,684,610 B2 | 4/2014 | Nichols | |
| 9,551,625 B2 | 1/2017 | Brugger et al. | |
| 9,608,371 B2 | 3/2017 | Bonzom et al. | |
| 9,608,382 B2 | 3/2017 | McClellan et al. | |
| 9,882,297 B2 | 1/2018 | Regnier | |
| 9,917,406 B1 | 3/2018 | Iwasaki et al. | |
| 10,355,383 B2 | 7/2019 | Consoli et al. | |
| 10,381,762 B2 * | 8/2019 | Consoli | H01R 13/6582 |
| 10,411,378 B2 * | 9/2019 | Consoli | H01R 12/737 |
| 10,461,470 B2 * | 10/2019 | Consoli | H01R 13/62938 |
| 10,522,925 B2 * | 12/2019 | Sypolt | H05K 1/14 |
| 2001/0016451 A1 * | 8/2001 | Kubo | H01R 13/4361 439/468 |
| 2002/0004326 A1 * | 1/2002 | Mochizuki | H01R 13/62933 439/157 |
| 2002/0071259 A1 | 6/2002 | Roos | |
| 2005/0064733 A1 | 3/2005 | Korsunsky et al. | |
| 2005/0070136 A1 | 3/2005 | Korsunsky et al. | |
| 2005/0181637 A1 | 8/2005 | Williams et al. | |
| 2007/0184676 A1 | 8/2007 | Minich | |
| 2008/0020613 A1 * | 1/2008 | Matsuura | H01R 13/62955 439/157 |
| 2008/0045087 A1 | 2/2008 | Yi et al. | |
| 2008/0166901 A1 | 7/2008 | Weber | |
| 2014/0065846 A1 | 3/2014 | Kida et al. | |
| 2014/0065849 A1 | 3/2014 | Kida et al. | |
| 2014/0187068 A1 * | 7/2014 | Chia | H01R 13/62972 439/160 |
| 2015/0333441 A1 * | 11/2015 | Annis | H01R 13/62911 439/133 |
| 2016/0006150 A1 | 1/2016 | Bachcmutsky | |
| 2016/0149342 A1 * | 5/2016 | Rodriguez | H01R 13/514 439/157 |
| 2018/0040989 A1 | 2/2018 | Chen | |
| 2018/0261941 A1 | 9/2018 | Consoli et al. | |
| 2019/0052001 A1 | 2/2019 | Consoli et al. | |
| 2019/0052008 A1 | 2/2019 | Consoli et al. | |
| 2019/0052014 A1 * | 2/2019 | Consoli | H01R 12/83 |
| 2019/0103691 A1 | 4/2019 | Sypolt et al. | |
| 2019/0103692 A1 | 4/2019 | Consoli et al. | |
| 2019/0252826 A1 * | 8/2019 | Consoli | H01R 13/62955 |

FOREIGN PATENT DOCUMENTS

| | | |
|---|---|---|
| JP | 2003044794 A | 2/2003 |
| TW | M537321 U | 2/2017 |
| WO | 2007092113 A2 | 8/2007 |
| WO | 2019030593 A1 | 2/2019 |
| WO | 2019030594 A1 | 2/2019 |

OTHER PUBLICATIONS

Kerridge "Fast Backplane Connectors Disguise Digital Transmission Lines" EDN—Electrical Design; 1997 (6 pages).

International Search Report and Written Opinion for corresponding Application No. PCT/IB2018/051321 dated Jun. 12, 2018 (9 pages).

* cited by examiner

CIRCUIT CARD ASSEMBLIES FOR A COMMUNICATION SYSTEM

BACKGROUND OF THE INVENTION

The subject matter herein relates generally to circuit card assemblies for communication systems.

Communication systems are in use in various applications, such as network switches. The communication systems include various circuit cards, such as backplanes and/or daughtercards, which are coupled together to electrically connect various circuits. For example, the circuit cards include electrical connectors that are mated to electrical connectors of one or more other circuit cards. Some communication systems use a backplane or midplane that is perpendicular to the mating direction of the daughtercards. However, such backplanes or midplanes block airflow through the communication system leading to overheating of components or limiting operating speeds to avoid overheating.

Other communication systems arrange both circuit cards parallel to the mating direction to allow airflow through the system. The circuit cards are typically oriented perpendicular to each other (for example, horizontally and vertically). The electrical connectors are provided at edges of both circuit cards and direct mate to each other. Conventional communication systems utilize right angle electrical connectors on both cards that direct mate with each other in an orthogonal orientation. The mating interfaces of the electrical connectors are parallel to the mating edges of the circuit cards such that the electrical connectors are mated in a direction parallel to the mating direction of the circuit cards. However, such right angle electrical connectors are expensive to manufacture and occupy a large amount of space in the system, thus blocking airflow through the system.

Some known communication systems orient the circuit cards perpendicular to each other with mating interfaces of the electrical connectors oriented perpendicular to the board mating direction. Having the mating interfaces perpendicular to the board mating direction poses problems in mating the contacts of the electrical connectors.

A need remains for a communication system allowing mating of electrical connectors in a reliable manner.

BRIEF DESCRIPTION OF THE INVENTION

In one embodiment, a communication system is provided including a first circuit card assembly having a first printed circuit board (PCB) and a first electrical connector mounted to the first PCB. The first electrical connector has a first mating end and first contacts at the first mating end. Each of the first contacts have a first mating interface. The first electrical connector has a receptacle housing and a mating housing received in the receptacle housing. The first electrical connector includes cam levers coupled between the mating housing and the receptacle housing to move the mating housing relative to the receptacle housing. The communication system includes a second circuit card assembly having a second PCB and a second electrical connector mounted to the second PCB. The second electrical connector has a second mating end and second contacts at the second mating end. Each of the second contacts have a second mating interface. The second mating end is mated to the first mating end to mate the second contacts and the first contacts. The second electrical connector has a header housing holding the second contacts. The second electrical connector includes driving elements interfacing with the cam levers to actuate the mating housing relative to the receptacle housing. At least one of the first PCB and the second PCB include a slot receiving the other of the first PCB and the second PCB in a board loading direction along a board loading axis. The header housing is coupled to the receptacle housing in the board loading direction as the first circuit card assembly and the second circuit card assembly are mated to interface the driving elements with the cam levers. The mating housing is movable away from the second mating end to a preloaded position by the driving elements. The mating housing is movable toward the second mating end to a mated position by the driving elements.

In another embodiment, a communication system is provided including a first circuit card assembly having a first printed circuit board (PCB) and a first electrical connector mounted to the first PCB. The first electrical connector has a first mating end and first contacts at the first mating end. Each of the first contacts have a first mating interface. The first electrical connector has a receptacle housing. The receptacle housing includes a front wall and a rear wall. The receptacle housing includes a top wall. The receptacle housing has a cavity defined by the front wall, the rear wall and the top wall. The first mating end is provided at a bottom of the receptacle housing opposite the top wall. The first electrical connector includes a mating housing received in the cavity of the receptacle housing. The first electrical connector includes cam levers coupled between the mating housing and the receptacle housing. The cam levers are configured to move the mating housing in the cavity relative to the receptacle housing. The communication system includes a second circuit card assembly having a second PCB and a second electrical connector mounted to the second PCB. The second electrical connector has a second mating end and second contacts at the second mating end. Each of the second contacts have a second mating interface. The second mating end is mated to the first mating end to mate the second contacts and the first contacts. The second electrical connector has a header housing holding the second contacts. The header housing has a front and a rear. The header housing has a top and a bottom. The second mating end is provided at the top of the header housing. The second electrical connector includes driving elements interfacing with the cam levers to actuate the mating housing relative to the receptacle housing. At least one of the first PCB and the second PCB include a slot receiving the other of the first PCB and the second PCB in a board loading direction along a board loading axis. The board loading direction is parallel to the bottom of the receptacle housing. The header housing is coupled to the receptacle housing in the board loading direction as the first circuit card assembly and the second circuit card assembly are mated to interface the driving elements with the cam levers. The mating housing is movable upward and rearward within the cavity to a preloaded position by the driving elements as the header housing is coupled to the receptacle housing in the board loading direction. The mating housing is movable downward toward the header housing to a mated position by the driving elements as the header housing is coupled to the receptacle housing in the board loading direction.

In a further embodiment, a circuit card assembly for a communication system is provided including a printed circuit board (PCB) having a first surface and a second surface and a mating edge between the first and second surfaces. The PCB has a slot extending inward from the mating edge configured to receive a second PCB of a second circuit card assembly in a board loading direction perpendicular to the mating edge. The PCB has a mounting area on the first surface adjacent the slot. An electrical connector is mounted to the first surface at the mounting area configured for mating with a second circuit card assembly. The electrical connector has a receptacle housing and a mating housing received in the receptacle housing and is movable relative to the receptacle housing. The electrical connector extends between a front and a rear. The electrical connector has a mounting end extending between the front and the rear is mounted to the mounting area. The electrical connector has a mating end extending between the front and the rear configured to be mated to the second electrical connector. The electrical connector has contacts held by the mating housing and is movable relative to the receptacle housing with the mating housing. The electrical connector includes cam levers coupled between the mating housing and the receptacle housing to move the mating housing relative to the receptacle housing. The receptacle housing is configured to be coupled to the second circuit card assembly in the board loading direction as the circuit card assembly and the second circuit card assembly are mated to actuate the cam levers. The mating housing is initially movable away from the mating end to a preloaded position by the driving elements and the mating housing is subsequently movable toward the mating end to a mated position by the driving elements.

DETAILED DESCRIPTION OF THE INVENTION

Figure 1:
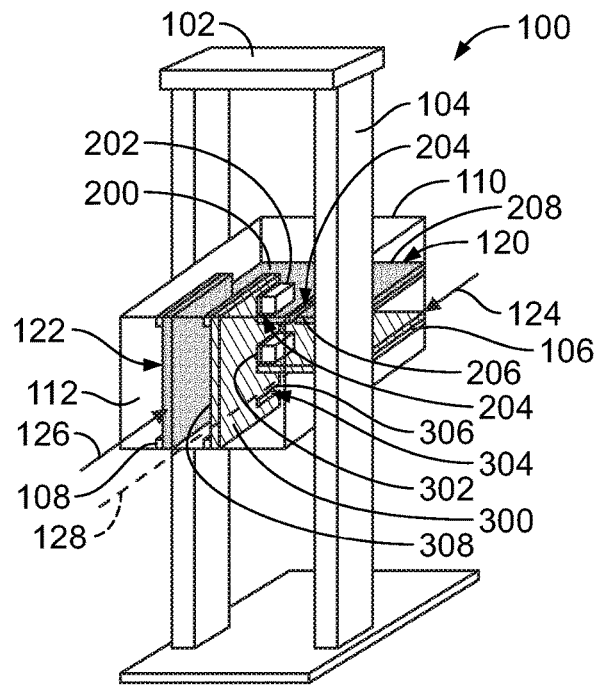
FIG. 1 illustrates a communication system formed in accordance with an exemplary embodiment.

FIG. 1 illustrates a communication system 100 formed in accordance with an exemplary embodiment. The communication system 100 includes a chassis 102 having a frame 104 configured to hold communication components, such as network components, such as circuit card assemblies. Optionally, the chassis 102 may include a cabinet (not shown) surrounding components of the communication system 100. In an exemplary embodiment, the frame 104 includes a plurality of racks 106, 108 for holding circuit card assemblies. For example, the communication system 100 may form part of a data center switch having one or more backplanes and/or daughter cards, such as line cards, switch cards or other types of circuit cards that may be electrically connected together.

In an exemplary embodiment, the communication system 100 includes a front end 110 and a rear end 112. The racks 106 are provided at the front end 110 and the racks 108 are provided at the rear end 112. One or more circuit card assemblies 120 may be received in the racks 106 at the front end 110 and one or more circuit card assemblies 122 may be received in the racks 108 at the rear end 112. The circuit card assemblies 120 may be referred to hereinafter as first circuit card assemblies 120 or front circuit card assemblies to differentiate from the circuit card assemblies 122, which may be referred to hereinafter as second circuit card assemblies 122 and/or rear circuit card assemblies 122. In an exemplary embodiment, the circuit card assemblies 120, 122 are orthogonal to each other. For example, in the illustrated embodiment, the front circuit card assemblies 120 are oriented horizontally while the rear circuit card assemblies 122 are oriented vertically; however, other orientations are possible in alternative embodiments.

The front circuit card assemblies 120 are electrically connected to one or more of the rear circuit card assemblies 122. Optionally, the front circuit card assemblies 120 and/or the rear circuit card assemblies 122 may be removable from the corresponding racks 106, 108. The racks 106, 108 guide and position the circuit card assemblies 120, 122, respectively. For example, the racks 106 position the front circuit card assemblies 120 for mating with multiple rear circuit card assemblies 122 and the racks 108 position the rear circuit card assemblies 122 for mating with multiple front circuit card assemblies 120. The front circuit card assemblies 120 may be loaded into the frame 104 through the front end 110 while the rear circuit card assemblies 122 may be loaded into the frame 104 through the rear end 112. For example, the front circuit card assemblies 120 are configured to be loaded into corresponding racks 106 in a loading direction 124 and the rear circuit card assemblies 122 are configured to be loaded into corresponding racks 108 in a loading direction 126. The loading directions 124, 126 may be parallel to a loading axis 128.

The first circuit card assembly 120 includes a first printed circuit board (PCB) 200 and a first electrical connector 202 mounted to the first PCB 200. The first PCB 200 may include any number of the electrical connectors 202, such as one electrical connector 202 for electrically connecting to each corresponding second circuit card assembly 122. Optionally, the first PCB 200 may include one or more first slots 204 for receiving PCBs of corresponding second circuit card assemblies 122 when mated thereto.

Figure 2:
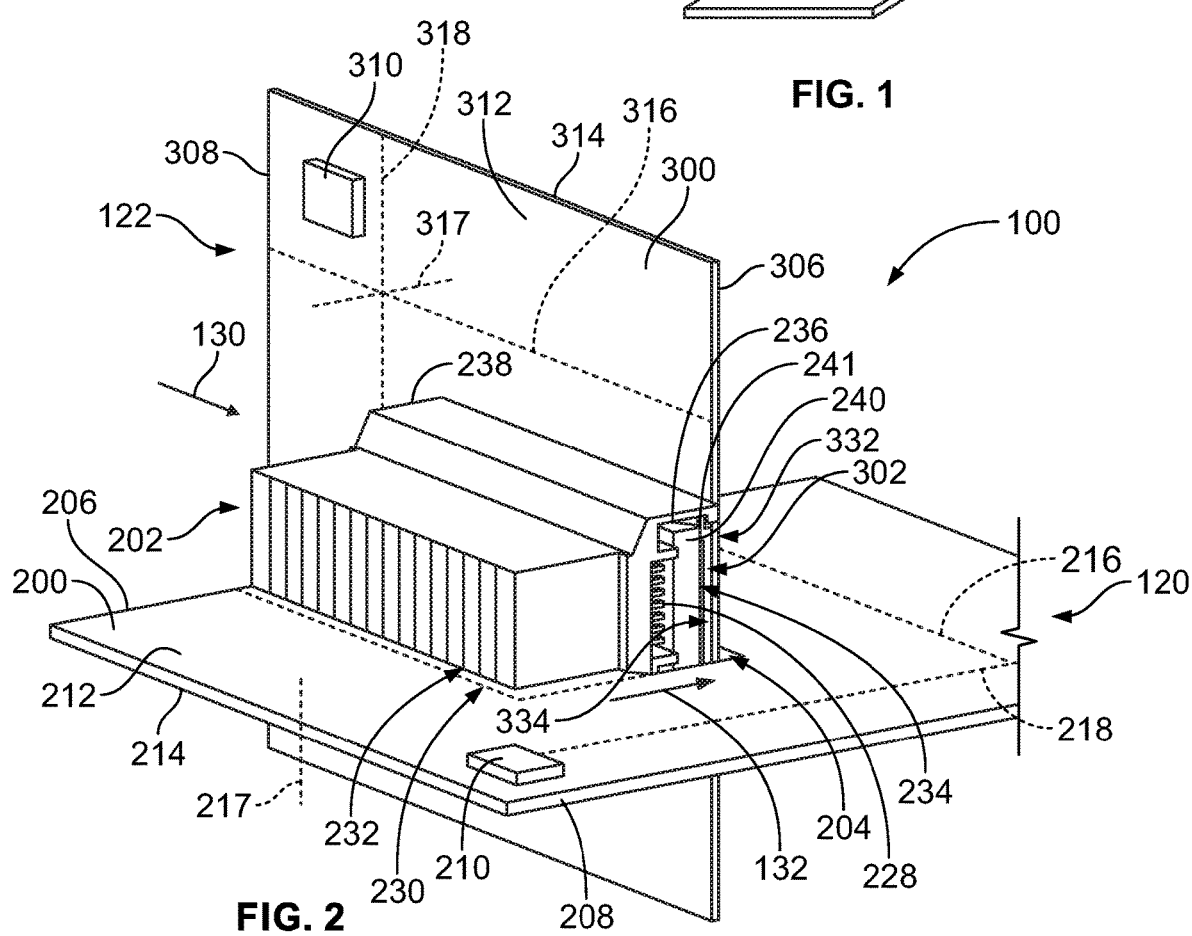
FIG. 2 is a perspective view of a portion of the communication system showing the first circuit card assembly coupled to the second circuit card assembly in accordance with an exemplary embodiment.

The first PCB 200 extends between a first mating edge 206 at a front of the PCB 200 and a rear edge 208 opposite the mating edge 206. Optionally, the rear edge 208 may include a handle or other feature for insertion and removal of the first circuit card assembly 120. The first PCB 200 may include one or more electrical components 210 (such as shown in FIG. 2) thereon. For example, the electrical components 210 may be processors, memory modules, batteries, fans, signal processing devices, and the like.

The second circuit card assembly 122 includes a second PCB 300 and a second electrical connector 302 mounted to the second PCB 300. The second PCB 300 may include any number of the electrical connectors 302, such as one electrical connector 302 for electrically connecting to each corresponding first circuit card assembly 120. In various embodiments, the second PCB 300 may define the second electrical connector configured to be directly mated to the first electrical connector 202. For example, the second PCB 300 may include contacts on the surface(s) of the second PCB 300 configured to be mated with the first electrical connector 202. The second PCB 300 extends between a second mating edge 306 at a front of the PCB 300 and a rear edge 308 opposite the mating edge 306. The first and second mating edges 206, 306 of the first and second PCBs 200, 300 interface with each other when the first and second circuit card assemblies 120, 122 are mated. For example, the fronts of the PCBs 200, 300 face each other and the rear edges 208, 308 face away from each other. Optionally, the rear edge 308 may include a handle or other feature for insertion and removal of the second circuit card assembly 122. The second PCB 300 may include one or more electrical components 310 (such as shown in FIG. 2) thereon. For example, the electrical components 310 may be processors, memory modules, batteries, fans, signal processing devices, and the like.

Optionally, the second PCB 300 may include one or more second slots 304 for receiving first PCBs 200 of corresponding first circuit card assemblies 120 when mated thereto. In various embodiments, both PCBs 200, 300 include the first and second slots 204, 304. In other various embodiments, only the first PCB 200 includes the first slots 204, whereas in other various embodiments, only the second PCB 300 includes the second slots 304.

The first slots 204 and/or the second slots 304 allow the first and second PCBs 200, 300 to be internested and overlapping such that the first and second electrical connectors 202, 302 are aligned for mating. For example, the first slots 204 and/or the second slots 304 allow the first and second PCBs 200, 300 to overlap to align mating ends of the first and second electrical connectors 202, 302 for mating. The arrangement allows the first and second electrical connectors 202, 302 to be mated in a mating direction perpendicular to the loading directions 124, 126. During mating, the first and second PCBs 200, 300 and the first and second electrical connectors 202, 302 may be loaded or mated together in a board loading direction 130 (FIG. 2) and at the end of the mating process the first and second electrical connectors 202, 302 may be mated in a connector mating direction 132 (FIG. 2) perpendicular to the board loading direction 130.

Having the first and second circuit card assemblies 122 internested and overlapped using the slot(s) 204, 304 allows the first and second electrical connectors 202, 302 to be elongated along the PCBs 200, 300 reducing one or more other dimensions of the electrical connectors 202, 302 (for example, a height and/or a width) allowing a greater amount of airflow through the communication system 100 (for example, from the front end 110 to the rear end 112 and/or from the rear end 112 to the front end 110. The arrangement may allow the PCBs 200, 300 to overlap to reduce one or more dimensions of the communication system 100, such as a front to rear length of the communication system 100.

Figure 4:
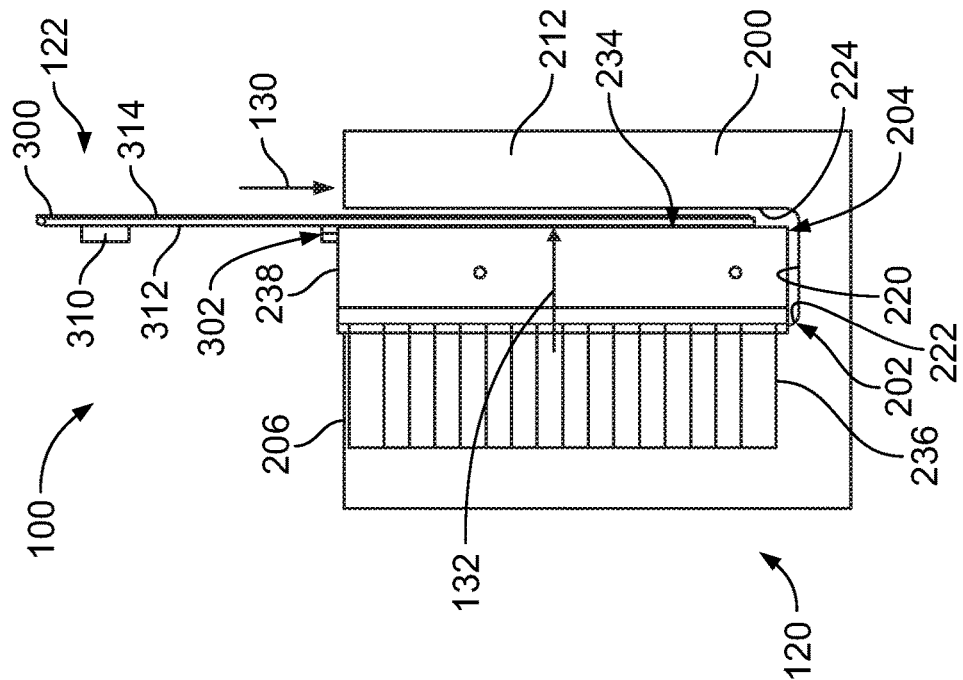
FIG. 4 is an end view of a portion of the communication system showing the first circuit card assembly coupled to the second circuit card assembly in accordance with an exemplary embodiment.
Figure 3:
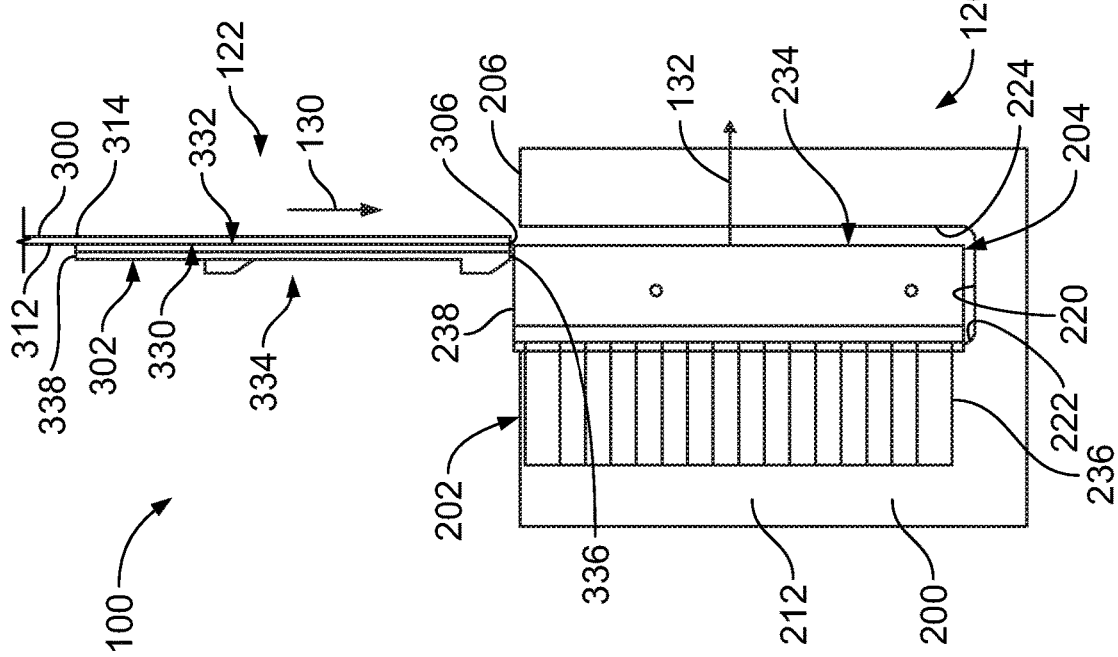
FIG. 3 is an end view of a portion of the communication system showing the first circuit card assembly poised for mating to the second circuit card assembly in accordance with an exemplary embodiment.
Figure 5:
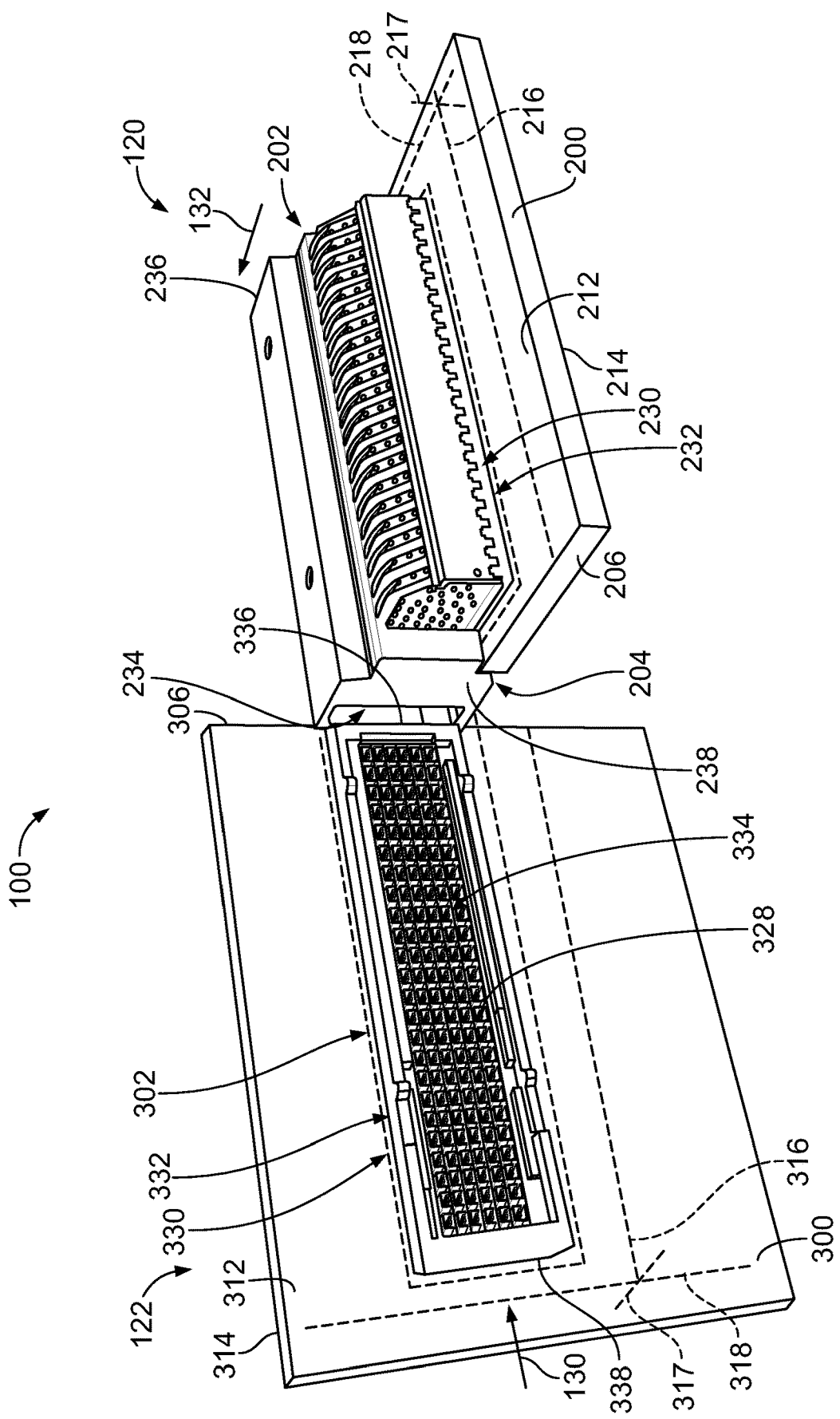
FIG. 5 is a perspective view of a portion of the communication system showing the first circuit card assembly and the second circuit card assembly poised for mating in accordance with an exemplary embodiment.

FIG. 2 is a perspective view of a portion of the communication system 100 showing the first circuit card assembly 120 coupled to the second circuit card assembly 122; however, it is noted that the first circuit card assembly 120 may be designed to be coupled to multiple circuit card assemblies 122 and/or the second circuit card assembly 122 may be designed to be coupled to multiple circuit card assemblies 120, such as in the arrangement illustrated in FIG. 1. FIG. 3 is an end view of a portion of the communication system 100 showing the first circuit card assembly 120 poised for mating to the second circuit card assembly 122. FIG. 4 is an end view of a portion of the communication system 100 showing the first circuit card assembly 120 coupled to the second circuit card assembly 122. FIG. 5 is a perspective view of a portion of the communication system 100 showing the first circuit card assembly 120 and the second circuit card assembly 122 poised for mating.

The terms "first", "second", etc. are used merely as labels to generally identify components of the first circuit card assembly 120 or the second circuit card assembly 122, respectively; however, such labels are not used exclusively with the circuit card assemblies 120, 122. Either or both of the circuit card assemblies 120, 122 may include any of the various components or elements described herein and some components may only be described with respect to either the circuit card assembly 120 or the circuit card assembly 122; however, the other of the circuit card assembly 120 or the circuit card assembly 122 may additionally include such components. Furthermore, the components may be described herein with or without the "first" label or the "second" label. The first and second circuit card assemblies 120, 122 are oriented perpendicular to each other and may be in any orientation. For example, the first PCB 200 may be oriented vertically or horizontally or at another orientation and the second PCB 300 may be oriented horizontally or vertically or at another orientation.

The first circuit card assembly 120 includes the first PCB 200 having the first slot 204 and the electrical connector 202 mounted to the PCB 200 proximate to the first slot 204. The PCB 200 includes a first surface 212 and a second surface 214 being the main surfaces of the PCB 200. In the illustrated embodiment, the first surface 212 is an upper surface and the second surface 214 is a lower surface; however, the PCB 200 may have other orientations in alternative embodiments. The first and second surfaces 212, 214 extend along a primary axis 216 and a secondary axis 218 perpendicular to the primary axis 216. The PCB 200 has a thickness between the first and second surfaces 212, 214 along a transverse axis 217 perpendicular to the primary and secondary axes 216, 218. In an exemplary embodiment, the primary and secondary axes 216, 218 are in a horizontal plane and the transverse axis 217 extends in a vertical direction; however, the PCB 200 may have other orientations in alternative embodiments. In an exemplary embodiment, the primary axis 216 extends between the mating edge 206 and the rear edge 208 (shown in FIG. 1). In an exemplary embodiment, the secondary axis 218 is parallel to the mating edge 206.

The first slot 204 extends entirely through the PCB 200 between the first and second surfaces 212, 214. The first slot 204 is open at the mating edge 206 to receive the second circuit card assembly 122. The first slot 204 extends a length along the primary axis 216 to an end edge 220 (shown in FIGS. 3 and 4) remote from the mating edge 206. The first slot 204 has first and second side edges 222, 224 extending between the mating edge 206 and the end edge 220. Optionally, the side edges 222, 224 may be generally parallel to each other. Alternatively, the side edges 222, 224 may be nonparallel, such as to taper the first slot 204. For example, the first slot 204 may be wider near the mating edge 206 and narrower near the end edge 220. Optionally, the side edges 222, 224 may have chamfered lead-ins at the mating edge 206 to guide the second circuit card assembly 122 into the first slot 204.

The first PCB 200 includes a mounting area 230 for the electrical connector 202 on the first surface 212. The mounting area 230 is adjacent the first slot 204. For example, the mounting area 230 extends along the mating edge 206 a distance from the first slot 204 and extends along the first side edge 222 of the first slot 204 a distance from the mating edge 206. Optionally, the mounting area 230 may extend beyond the end edge 220 of the first slot 204. The electrical connector 202 is terminated to the PCB 200 at the mounting area 230. For example, contacts 228 that extend through the electrical connector 202 may be soldered to the PCB 200 at the mounting area 230. The mounting area 230 may include plated vias that receive compliant pins or solder tails of the contacts 228 of the electrical connector 202 for termination of the contacts 228 to the PCB 200. Optionally, at least a portion of the electrical connector 202 may extend beyond the first side edge 222 over the first slot 204 and/or at least a portion of the electrical connector 202 may extend forward of the mating edge 206 and/or at least a portion of the electrical connector 202 may extend rearward of the end edge 220. In other various embodiments, the PCB 200 may include more than one mounting area 230 adjacent the first slot 204 for receiving additional electrical connectors 202. For example, multiple electrical connectors 202 may be electrically connected to the same circuit card assembly 122. For example, additional electrical connectors 202 may be provided on both sides of the first slot 204 and/or both sides of the PCB 200.

The first electrical connector 202 is mounted to the PCB 200 at the mounting area 230. In the illustrated embodiment, the electrical connector 202 is a right angle connector having a mounting end 232 perpendicular to a mating end 234. For example, the mounting end 232 may be provided at a bottom of the electrical connector 202 and the mating end 234 may be provided at a side of the electrical connector 202. In an alternative orientation, the mating end 234 may be provided at a bottom of the electrical connector 202 and the mounting end 232 may be provided at a side of the electrical connector 202. The electrical connector 202 extends between a front 236 and a rear 238 opposite the front 236. The rear 238 is provided at the mating edge 206 and is configured to receive the second electrical connector 302 when mated in the board loading direction 130. The mounting end 232 extends between the front 236 and the rear 238. The mounting end 232 is mounted to the PCB 200. For example, the electrical connector 202 is mechanically and electrically terminated to the PCB 200 at the mounting end 232. The mating end 234 extends between the front 236 and the rear 238. In the illustrated embodiment, the mating end 234 generally faces the first slot 204 for interfacing with the second electrical connector 302 when the second circuit card assembly 122 is received in the first slot 204. The mating end 234 is configured to be mated to the mating electrical connector defined by the second electrical connector 302 when the second circuit card assembly 122 is received in the first slot 204.

In an exemplary embodiment, the mating end 234 is oriented generally vertically along the transverse axis 217 and extends parallel to the primary axis 216. The mating end 234 faces sideways rather than rearward. For example, the mating end 234 is perpendicular to the mating edge 206 of the PCB 200. The front 236 is oriented generally vertically along the transverse axis 217 and extends parallel to the secondary axis 218. The rear 238 may be positioned a first distance from the mating edge 206 (either forward of, rearward of or flush with the mating edge 206) and the front 236 is positioned a second distance from the mating edge 206 greater than the first distance. The mating end 234 spans a majority of the distance between the front 236 and the rear 238. The rear 238 is rearward facing to receive the second electrical connector 302 and, in the illustrated embodiment, is provided near the mating edge 206, such as generally flush with the mating edge 206.

The second circuit card assembly 122 includes the second PCB 300, which may or may not include a slot. In the illustrated embodiment, the PCB 300 does not include a slot. The PCB 300 includes a first surface 312 and a second surface 314 being the main surfaces of the PCB 300. In the illustrated embodiment, the first surface 312 defines a first side and the second surface 314 defines a second side of the PCB 300; however, the PCB 300 may have other orientations in alternative embodiments, such as with the first surface 312 being an upper surface and the second surface 314 being a lower surface. The first and second surfaces 312, 314 extend along a primary axis 316 and a secondary axis 318 perpendicular to the primary axis 316. The PCB 300 has a thickness between the first and second surfaces 312, 314 along a transverse axis 317 perpendicular to the primary and secondary axes 316, 318. In an exemplary embodiment, the primary and secondary axes 316, 318 are in a vertical plane and the transverse axis 317 extends in a horizontal direction; however, the PCB 300 may have other orientations in alternative embodiments. In an exemplary embodiment, the primary axis 316 extends between the mating edge 306 and the rear edge 308 (shown in FIG. 1). In an exemplary embodiment, the secondary axis 318 is parallel to the mating edge 306.

In an exemplary embodiment, at least a portion of the PCB 300 is configured to be received in the first slot 204 that may at least partially fill the first slot 204. Such portion may engage the end edge 220, the first side edge 222 and/or the second side edge 224 of the first slot 204 when received therein.

The second PCB 300 includes a mounting area 330 (FIG. 3) for the electrical connector 302 on the first surface 312. The mounting area 330 extends from the mating edge 306 a distance. The electrical connector 302 is terminated to the PCB 300 at the mounting area 330. For example, contacts 328 (FIG. 5) of the electrical connector 302 may be soldered to the PCB 300 at the mounting area 330. The mounting area 330 may include plated vias that receive compliant pins or solder tails of the contacts 328 of the electrical connector 302 for termination of the contacts 328 to the PCB 300. Optionally, at least a portion of the electrical connector 302 may extend forward of the mating edge 306. In other various embodiments, the PCB 300 may include more than one mounting area 330 for receiving additional electrical connectors 302. For example, multiple electrical connectors 302 may be electrically connected to the same circuit card assembly 122.

The second electrical connector 302 is mounted to the PCB 300 at the mounting area 330. In the illustrated embodiment, the electrical connector 302 is a header connector having a mounting end 332 parallel to a mating end 334. For example, the mounting end 332 may be provided along one side of the electrical connector 302 and the mating end 334 may be provided at the opposite side of the electrical connector 302. When the second PCB has a horizontal orientation, the mating end 334 may be a top of the electrical connector 302 and the mounting end 332 may be a bottom of the electrical connector 302. Optionally, the mounting end 332 and the mating end 334 may be parallel to each other and non-coplanar. The electrical connector 302 extends between a front 336 (FIG. 3) and a rear 338 (FIG. 3) opposite the front 336. The front 336 is configured to be mated to the first electrical connector 202 in the board loading direction 130. The mounting end 332 and the mating end 334 both extend between the front 336 and the rear 338. The mounting end 332 is mounted to the PCB 300. For example, the electrical connector 302 is mechanically and electrically terminated to the PCB 300 at the mounting end 332. In the illustrated embodiment, the mating end 334 is oriented for interfacing with the first electrical connector 202 when the second circuit card assembly 122 is received in the first slot 204.

In an exemplary embodiment, the mating end 334 is oriented generally vertically and extends parallel to the primary axis 316. The mating end 334 faces sideways rather than forward. For example, the mating end 334 is perpendicular to the mating edge 306 of the PCB 300. The front 336 is oriented generally vertically and extends parallel to the secondary axis 318. When the second PCB has a horizontal orientation, the mating end 334 and the front 336 may be oriented generally horizontally rather than vertically. The front 336 may be positioned a first distance from the mating edge 306 (either forward of, rearward of or flush with the mating edge 306) and the rear 338 is positioned a second distance from the mating edge 306 greater than the first distance. The mating end 334 spans a majority of the distance between the front 336 and the rear 338. The front 336 is forward facing and, in the illustrated embodiment, is provided near the mating edge 306, such as generally flush with the mating edge 306.

When the first and second circuit card assemblies 120, 122 are mated, the first and second PCBs 200, 300 are internested and the second PCB 300 is received in the first slot 204. When mated, the first PCB 200 at least partially overlaps with the second PCB 300 to align the mating ends 234, 334 of the electrical connectors 202, 302. For example, the mating edges 206, 306 bypass each other as the second PCB 300 is received in the first slot 204. During mating, the contacts 328 are moved in a board loading direction 130 (for example, parallel to the primary axis 316 of the PCB 300) and the contacts 228 are moved in a connector mating direction 132 (for example, perpendicular to the board loading direction 130) as the first and second electrical connectors 202, 302 are mated. For example, a portion of the first electrical connector 202 is moved toward the second electrical connector 302.

Figure 6:
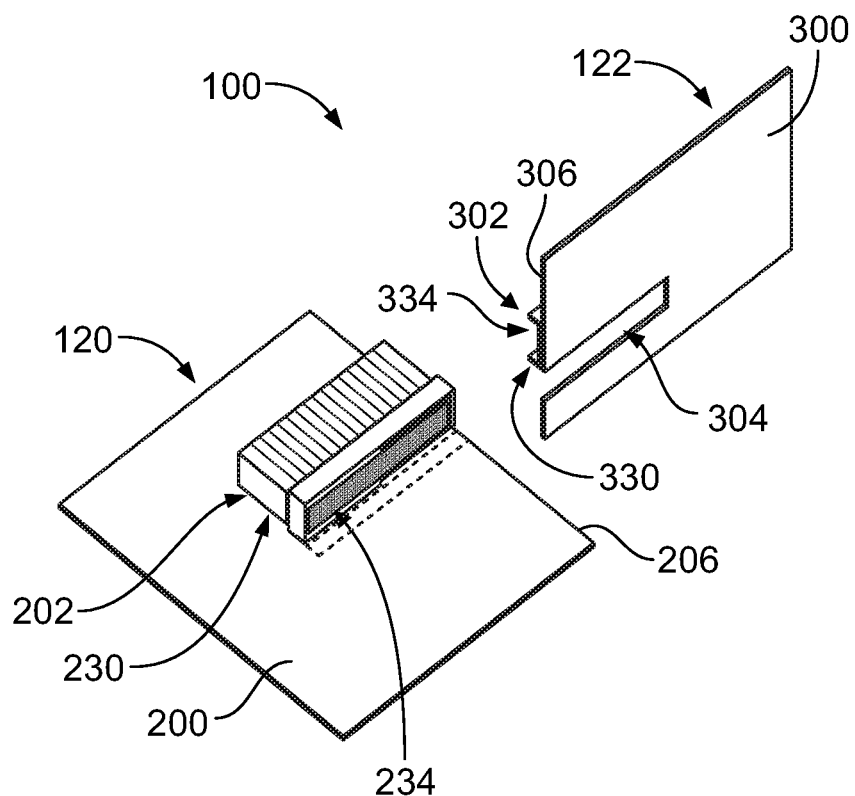
FIG. 6 is a perspective view of a portion of the communication system in accordance with an exemplary embodiment.

FIG. 6 is a perspective view of a portion of the communication system 100 in accordance with an exemplary embodiment. FIG. 6 shows the second circuit card assembly 122 with the second slot 304 and the first circuit card assembly 120 without the first slot 204 (shown in FIG. 5). Optionally, at least a portion of the first PCB 200 is configured to at least partially fill the second slot 304. The second electrical connector 302 is mounted to the mounting area 330 adjacent the second slot 304. When the first and second circuit card assemblies 120, 122 are mated, the first and second PCBs 200, 300 are internested with the first PCB 200 being received in the second slot 304. When mated, the first PCB 200 at least partially overlaps with the second PCB 300 to align the mating ends 234, 334 of the electrical connectors 202, 302. For example, the mating edges 206, 306 bypass each other as the first PCB 200 is received in the second slot 304.

Figure 7:
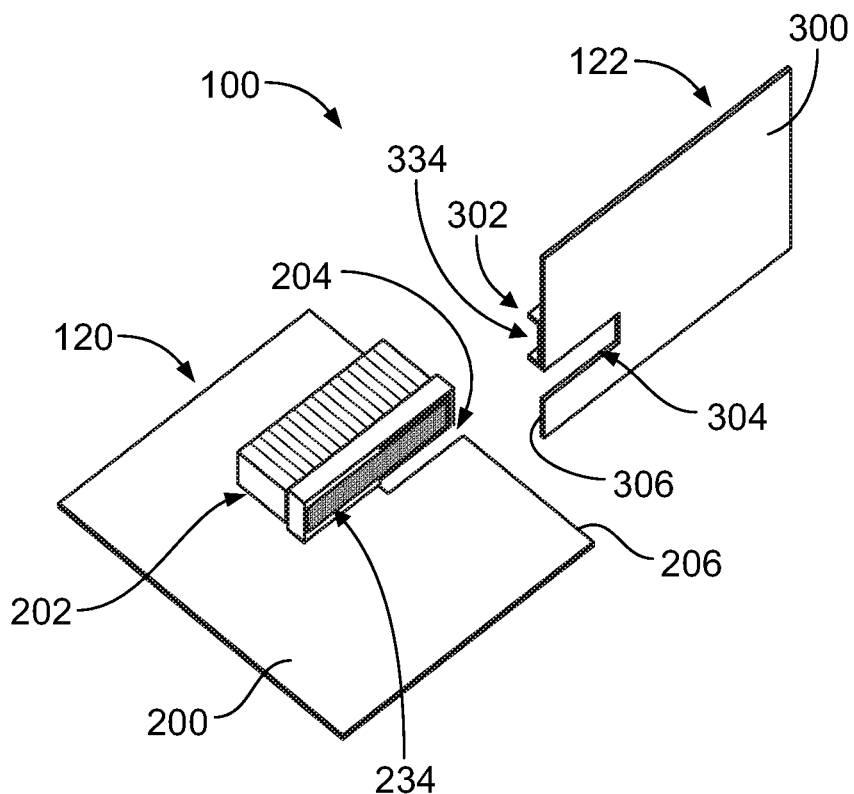
FIG. 7 is a perspective view of a portion of the communication system in accordance with an exemplary embodiment.

FIG. 7 is a perspective view of a portion of the communication system 100 in accordance with an exemplary embodiment. FIG. 7 shows the first circuit card assembly 120 with the first slot 204 and the second circuit card assembly 122 with the second slot 304. When the first and second circuit card assemblies 120, 122 are mated, the first and second PCBs 200, 300 are internested with the first PCB 200 being received in the second slot 304 and with the second PCB 300 being received in the first slot 204. When mated, the first PCB 200 at least partially overlaps with the second PCB 300 to align the mating ends 234, 334 of the electrical connectors 202, 302. For example, the mating edges 206, 306 bypass each other as the PCBs 200, 300 are received in the second and first slots 304, 204, respectively.

Figure 8:
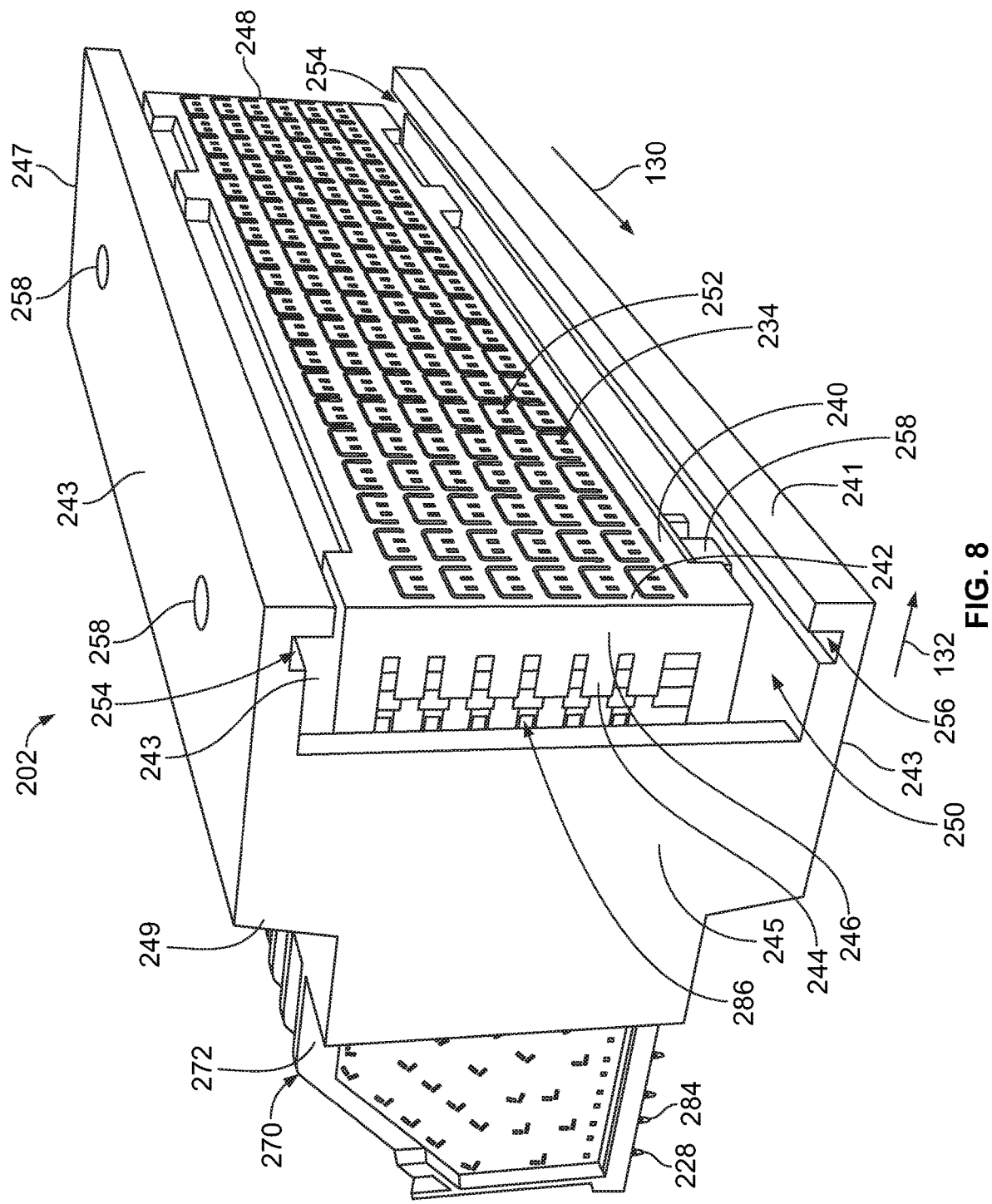
FIG. 8 is a side perspective view of the first electrical connector in accordance with an exemplary embodiment.
Figure 9:
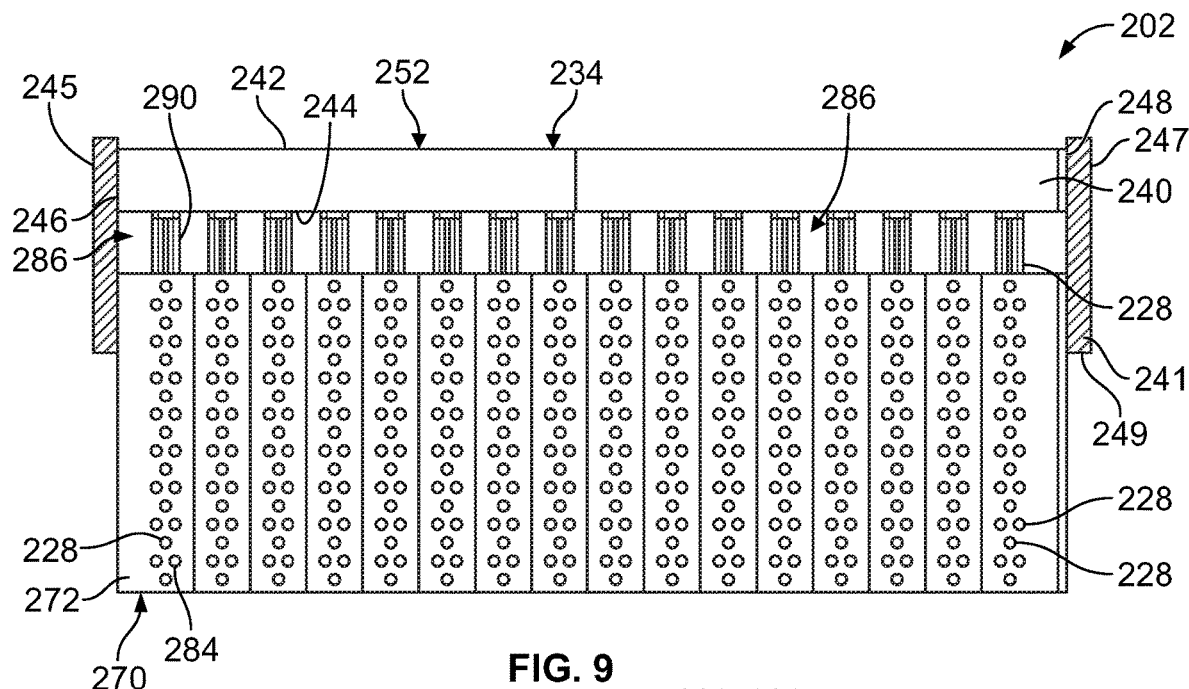
FIG. 9 is a bottom view of the first electrical connector in accordance with an exemplary embodiment.
Figure 10:
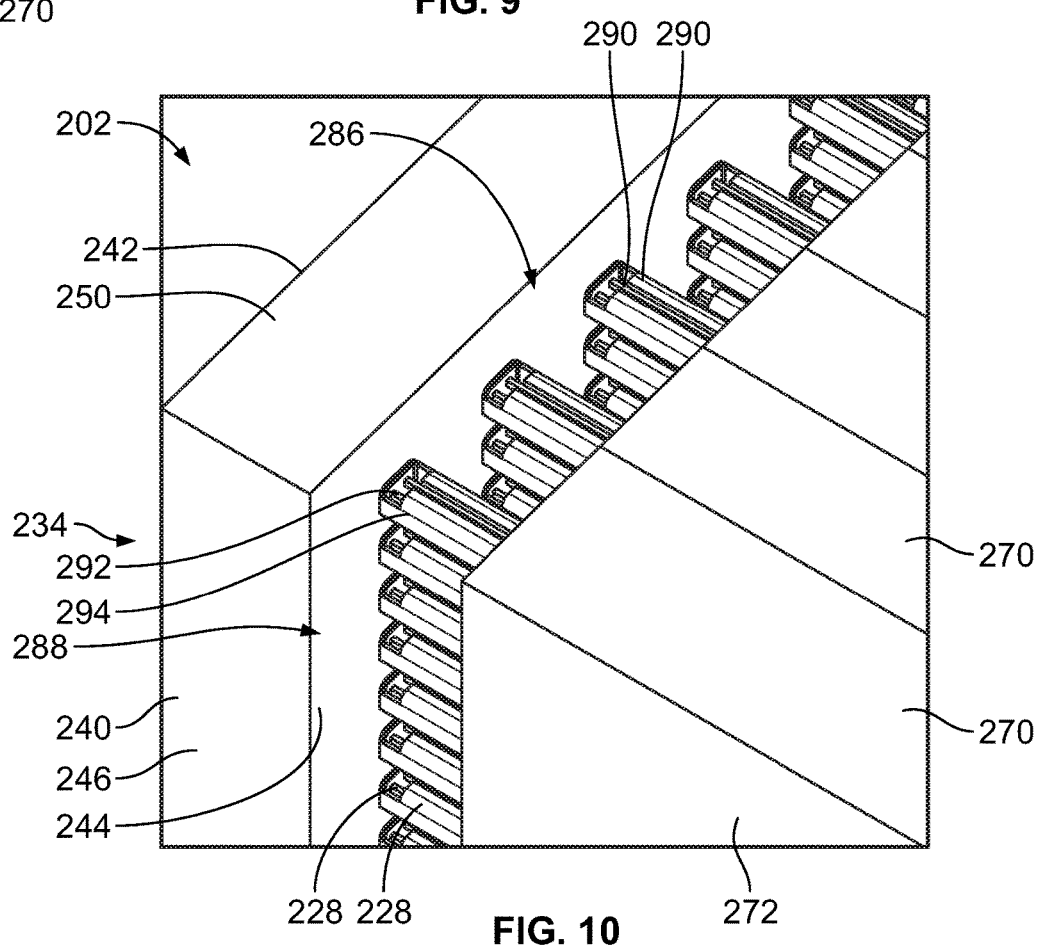
FIG. 10 is a perspective view of a portion of the first electrical connector in accordance with an exemplary embodiment.

FIG. 8 is a side perspective view of the first electrical connector 202 in accordance with an exemplary embodiment. FIG. 9 is a bottom view of the first electrical connector 202 in accordance with an exemplary embodiment. FIG. 10 is a perspective view of a portion of the first electrical connector 202 in accordance with an exemplary embodiment.

In an exemplary embodiment, the first electrical connector 202 includes a mating housing 240 at the mating end 234 and a receptacle housing 241 (shown in cross section in FIG. 9 and removed in FIG. 10 to illustrate other components) surrounding at least a portion of the mating housing 240. The mating housing 240 is movable within the receptacle housing 241, such as in the connector mating direction 132. Such movement allows mating of the first contacts 228 with the second contacts 328 (see FIG. 14) of the second electrical connector 302.

The mating housing 240 includes a first side 242, a second side 244, a front 246 and a rear 248. In various embodiments, the first electrical connector 202 is oriented such that the first side 242 is a bottom of the mating housing 240 and the second side 244 is a top of the mating housing 240. The first side 242 defines the mating end 234 of the electrical connector 202. The mating end 234 is oriented perpendicular to the first PCB 200 (shown in FIG. 2). In an exemplary embodiment, the mating housing 240 holds the contacts 228 for mating with the second electrical connector 302 (shown in FIG. 2). For example, each contact 228 may include a pin, a socket, a spring beam or other type of mating interface (not shown) at a mating end of the contact 228 for mating with the second electrical connector 302. The mating ends of the contacts 228 are provided at the first side 242 in a predetermined layout for mating with the second electrical connector 302. In various embodiments, the mating ends of the contacts 228 are recessed within channels within the mating housing 240 that also receive the contacts 328 of the second electrical connector 302 when mated thereto. In alternative embodiments, the mating ends of the contacts 228 may extend or protrude from the first side 242 of the mating housing 240.

The receptacle housing 241 includes end walls 243 extending between a front wall 245 and a rear wall 247. The receptacle housing 241 includes a top wall 249 extending between the end walls 243 and between the front wall 245 and the rear wall 247. The walls 243, 245, 247, 249 define a cavity 250 that receives the mating housing 240. In an exemplary embodiment, a bottom 252 of the first electrical connector 202 opposite the top wall 249 is open, such as to receive the second electrical connector 302. In an exemplary embodiment, the first electrical connector 202 include connecting elements 254 (FIG. 8) along the end walls 243 for connecting the first electrical connector 202 to the second electrical connector 302. In the illustrated embodiment, the connecting elements 254 includes guide slots 256 defined by grooves in the receptacle housing 241 configured to receive portions of the second electrical connector 302. The connecting elements 254 secure the receptacle housing 241 to the second electrical connector 302 as the electrical connectors 202, 302 are coupled together (for example, as the PCBs 200, 300 are moved in the board loading direction). Other types of connecting elements 254 may be provided in alternative embodiments, such as pins, clips, fasteners, and the like.

The electrical connector 202 includes drive members at the end walls 243 for actuating the mating housing 240 relative to the receptacle housing 241 during mating. In the illustrated embodiment, the drive members are cam levers 258 operably coupled to the mating housing 240 and the receptacle housing 241. The cam levers 258 may be positioned in the cavity 250, such as at the end wall(s) 243. The cam levers 258 are operably coupled to the receptacle housing 241 and operably coupled to the mating housing 240. As the cam levers 258 are operated, the cam levers 258 move the mating housing 240 relative to the receptacle housing 241. In an exemplary embodiment, the cam levers 258 move the mating housing 240 to a preloaded position to position the contacts 228 for mating with the second electrical connector 302. The cam levers 258 move the mating housing 240 in the connector mating direction 132 to a mated position. The contacts 228 are mated to the second electrical connector 302 in the mated position. In an exemplary embodiment, the cam levers 258 may be actuated by engagement with the second electrical connector 302 as the first and second electrical connectors 302 are coupled together in the board loading direction 130. For example, actuators or driving elements may be provided on the second electrical connector 302 to actuate the cam levers 258 as the cam levers 258 engage the driving elements. In an exemplary embodiment, multiple cam levers 258 are provided, such as at a front section and a rear section of the electrical connector 202. More than two cam levers 258 may be provided along either or both sides of the electrical connector 202. Other types of drive members may be provided in alternative embodiments, such as cam pins configured to be received in cam sockets, pinions configured to engage a rack, a crank configured to engage a rack, a crank configured to engage an idler gear, one or more linkages configured to engage an actuator, and the like.

In an exemplary embodiment, the electrical connector 202 includes contact modules 270 each holding a plurality of the contacts 228. The contact modules 270 may be coupled to the receptacle housing 241 and/or the mating housing 240, such as at the second side 244. For example, in the illustrated embodiment, the contact modules 270 are loaded into the receptacle housing 241 and coupled to the mating housing 240. In an exemplary embodiment, each contact module 270 includes a dielectric body 272 holding corresponding contacts 228. For example, the dielectric body 272 may be overmolded around portions of the contacts 228. Optionally, the contact modules 270 may include ground shields (not shown) to provide electrical shielding for the contacts 228. Any number of the contact modules 270 may be stacked together depending on the particular application. The number of contacts 228 within the electrical connector 202 may be increased or decreased by changing the number of contact modules 270 rather than retooling to increase the number of contacts per contact module, as is common in conventional systems, such retooling being expensive. The contacts 228 include terminating ends 284 extending from the dielectric body 272 that are terminated to the first PCB 200. For example, the terminating ends 284 may be compliant pins, solder tail or another type of terminating end.

In an exemplary embodiment, the electrical connector 202 includes a compliant section 286 between the contact modules 270 and the mating housing 240 that allows the mating housing 240 to shift relative to the contact modules 270, such as during mating with the second electrical connector 302. The contacts 228 include flexible sections 290 to allow relative movement of the mating ends of the contacts 228 and the mating housing 240.

In an exemplary embodiment, the contacts 228 include signal contacts and ground contacts. Optionally, the signal contacts may be arranged in pairs configured to convey differential signals. The ground contacts are interspersed with the signal contacts to provide electrical shielding for the signal contacts. The signal contacts and/or the ground contacts may be stamped and formed contacts.

Figure 11:
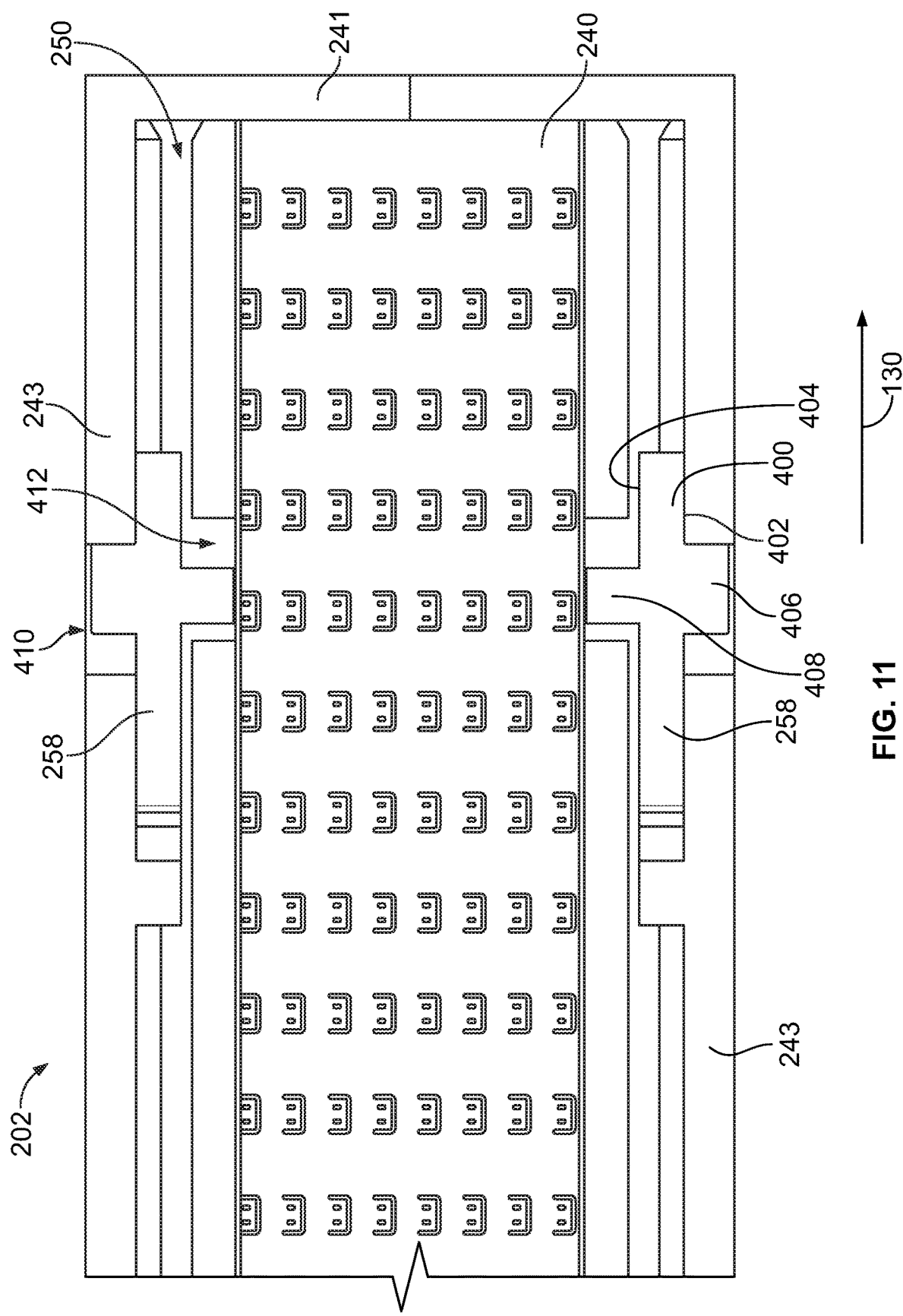
FIG. 11 is a partial sectional view of a portion of the first electrical connector in accordance with an exemplary embodiment.

FIG. 11 is a partial sectional view of a portion of the first electrical connector 202. FIG. 11 shows the mating housing 240 positioned in the cavity 250. The cam levers 258 are positioned between the mating housing 240 and the receptacle housing 241. In the illustrated embodiment, the cam levers 258 have a body 400 extending between a first side 402 and a second side 404.

The cam levers 258 include a fixed pivot 406 extending from the first side 402 and a movable pivot 408 extending from the second side 404. The fixed pivot 406 is received in an opening 410 in the corresponding end wall 243 of the receptacle housing 241. The movable pivot 408 is received in a cam slot 412 in the mating housing 240. The cam levers 258 are pivotable about the fixed pivot 406 to cause the movable pivot 408 to move relative to the receptacle housing 241. As the movable pivot 408 is rotated, the movable pivot 408 moves in the cam slot 412 relative to the receptacle housing 241. The cam lever 258 is used to move the mating housing 240 relative to the receptacle housing 241, such as in a preloading direction and in the connector mating direction 132 (shown in FIG. 8).

Figure 12:
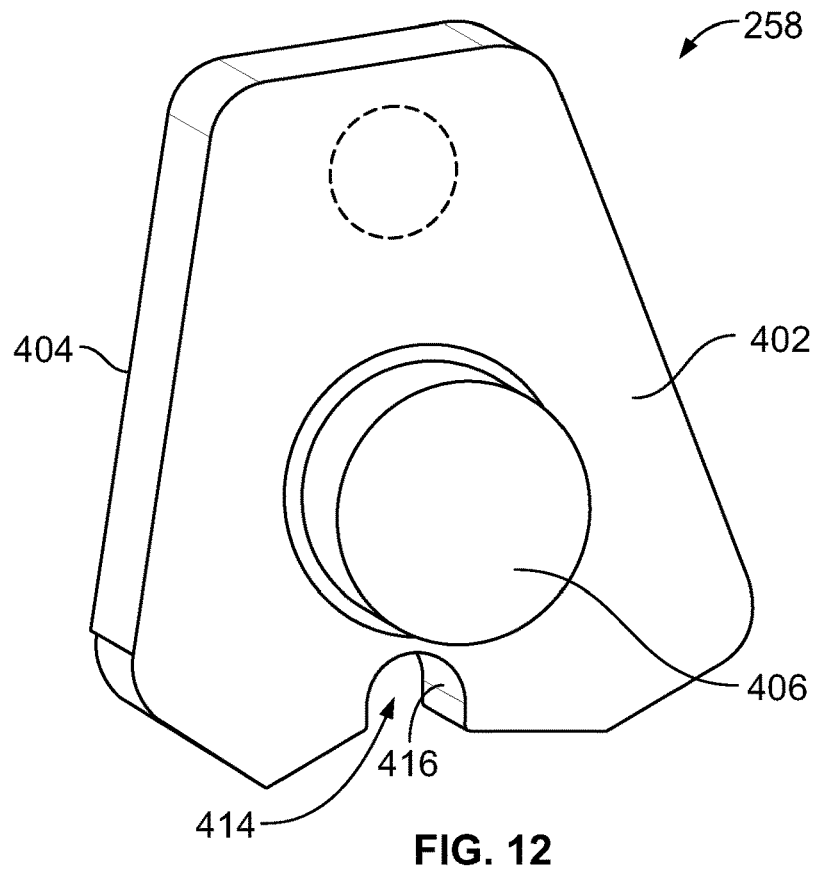
FIG. 12 is a perspective view of the first side of the cam lever in accordance with an exemplary embodiment.
Figure 13:
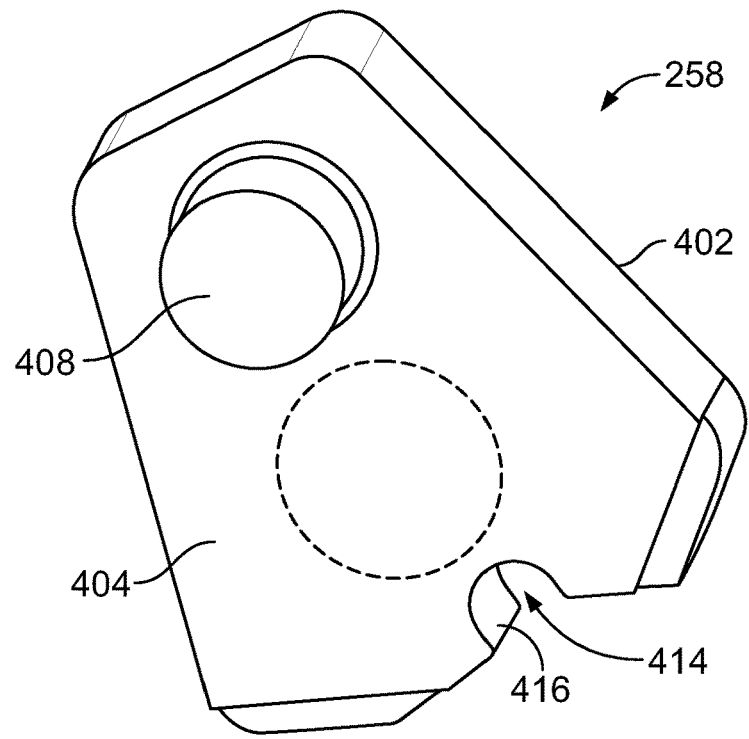
FIG. 13 is a perspective view of the second side of the cam lever in accordance with an exemplary embodiment.

FIG. 12 is a perspective view of the first side 402 of the cam lever 258 in accordance with an exemplary embodiment. FIG. 13 is a perspective view of the second side 404 of the cam lever 258 in accordance with an exemplary embodiment. The cam lever 258 includes the fixed pivot 406 (FIG. 12) at the first side 402 and the movable pivot 408 (FIG. 13) at the second side 404. In an exemplary embodiment, the cam lever 258 includes a cam surface 414 configured to engage a driving element of the second electrical connector 302 to drive or actuate the cam levers 258. In an exemplary embodiment, the cam surface 414 includes a pocket 416. The cam surface 414 may have other shapes in alternative embodiments. In an exemplary embodiment, the cam lever 258 includes the cam surface 414 at the bottom of the cam lever 258. In the illustrated embodiment, the cam lever 258 is wedge shaped being narrower at the top and wider at the bottom. Other shapes are possible in alternative embodiments.

Figure 14:
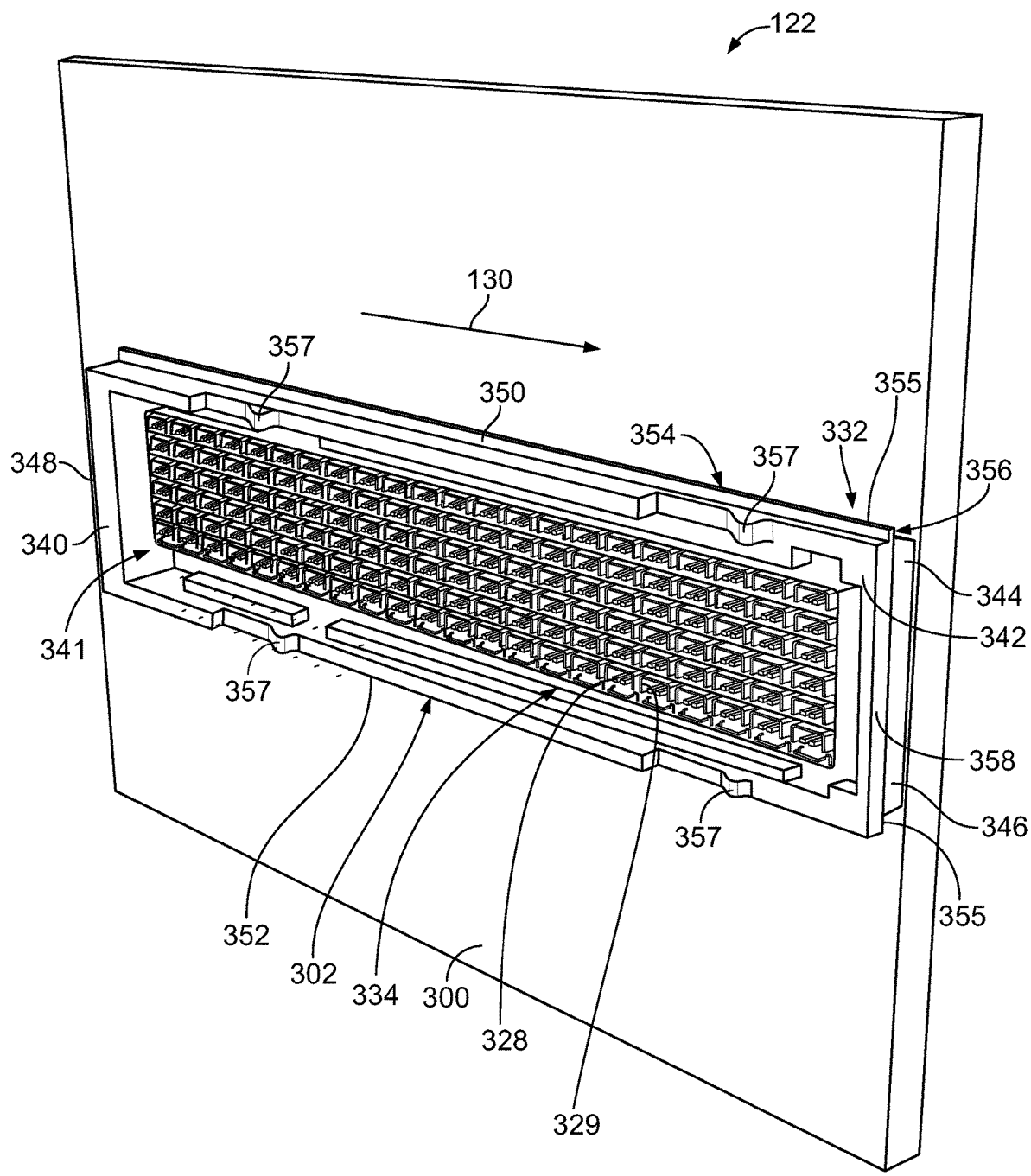
FIG. 14 is a perspective view of a portion of the second circuit card assembly in accordance with an exemplary embodiment.
Figure 15:
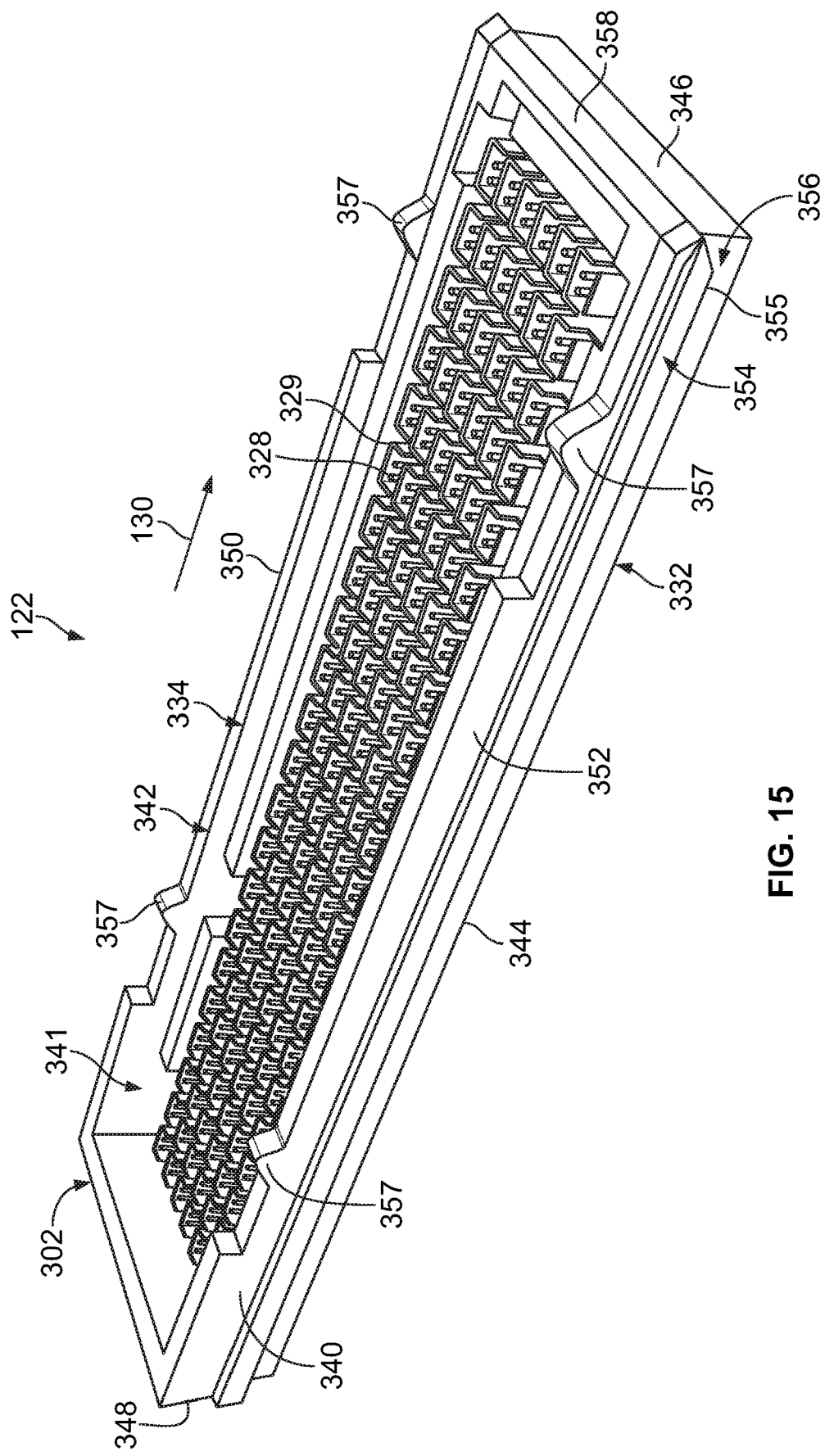
FIG. 15 is a perspective view of a portion of the second electrical connector in accordance with an exemplary embodiment.

FIG. 14 is a perspective view of a portion of the second circuit card assembly 122 in accordance with an exemplary embodiment. FIG. 15 is a perspective view of a portion of the second electrical connector 302 in accordance with an exemplary embodiment. In an exemplary embodiment, the electrical connector 302 includes a header housing 340 holding the contacts 328. The header housing 340 includes walls defining a cavity 341 configured to receive the mating housing 240 of the first electrical connector 202 (both shown in FIG. 8).

The header housing 340 includes a first side 342, a second side 344, a front 346 and a rear 348. In an exemplary embodiment, the first side 342 is a top of the header housing 340 and the second side 344 is a bottom of the header housing 340; however, the header housing 340 may be arranged in a different orientation (e.g., vertically) in alternative embodiments. The first side 342 defines the mating end 334 of the electrical connector 302. The mating end 334 is oriented parallel to the second PCB 300. In an exemplary embodiment, the header housing 340 holds the contacts 328 for mating with the first electrical connector 202. For example, each of the contacts 328 includes a mating end for mating with the first electrical connector 202. In an exemplary embodiment, the second electrical connector 302 includes ground contacts 329 providing electrical shielding for the signal contacts 328. For example, the ground contacts 329 may be U-shaped.

The header housing 340 includes a first end 350 and a second end 352. In an exemplary embodiment, the ends 350, 352 include connecting elements 354 for connecting the second electrical connector 302 to the first electrical connector 202. In the illustrated embodiment, the connecting elements 354 include pockets 356 defined by ledges 355 configured to be received in the guide slots 256 (shown in FIG. 8) of the receptacle housing 241 of the first electrical connector 202. Other types of connecting elements 354 may be provided in alternative embodiments, such as pins, clips, fasteners, and the like.

The header housing 340 includes driving elements 357 at the first side 342 configured to actuate the cam levers 258 (shown in FIGS. 12 and 13). In the illustrated embodiment, the driving elements 357 include protrusions extending from the first side 342. Other types of driving elements 357 may be provided in alternative embodiments. The driving elements 357 engage the cam levers 258 and actuate the cam levers 258 as the header housing 340 is loaded into the receptacle housing 241 during mating of the first and second electrical connectors 202, 302 in the board loading direction 130. In the illustrated embodiment, the header housing 340 includes multiple driving elements 357 laterally spaced apart, such as for actuating multiple cam levers 258. Optionally, the driving elements 357 may be at different heights, such as shorter at the front section and taller at the rear section to allow actuation of different cam levers 258. Optionally, the driving elements 357 may be staggered within the cavity such as closer in or further out to align with corresponding staggered cam levers 258.

The header housing 340 defines the mounting end 332 of the electrical connector 302 configured to be mounted to the PCB 300. Optionally, portions of the contacts 328 may extend beyond the mounting end 332 for termination to the PCB 300. For example, the contacts 328 may include terminating ends (not shown), such as compliant pins, solder tails, and the like, configured to be terminated to the PCB 300.

In an exemplary embodiment, the header housing 340 includes ramps 358 at the front 346. The ramps 358 are configured to engage the mating housing 240 of the first electrical connector 202. The ramps 358 are used to preload the mating housing 240. The ramps 358 push the mating housing 240 away from the mating end 334.

FIGS. 16-27 illustrate a mating process of the first electrical connector 202 with the second electrical connector 302. Portions of the electrical connectors 202, 302 are removed for clarity. FIGS. 16-27 illustrate the interaction between the header housing 340 and the receptacle housing 241. For example, FIGS. 16-27 illustrate the header housing 340 loaded into the receptacle housing 241 in the board loading direction 130. FIGS. 16-27 illustrate the interaction between the header housing 340 and the mating housing 240. For example, FIGS. 16-27 illustrate the mating housing 240 moving relative to the receptacle housing 241 between a normal or resting position, a preloaded position, a mated position, and an over mated position. FIGS. 16-27 illustrate the operation of the cam levers 258 to position the mating housing 240 relative to the receptacle housing 241 and the mating housing 240. FIGS. 16-27 illustrate the interaction between the cam levers 258 and the driving elements 357. The first contacts 228 (removed for clarity) are movable with the mating housing 240 relative to the header housing 340 during mating. In an exemplary embodiment, during mating, as the header housing 340 is moved in the board loading direction 130, the mating housing 240 is mated in the connector mating direction 132, which is perpendicular to the board loading direction 130. As such, the first contacts 228 are mated with the second contacts 328 (removed for clarity) in the connector mating direction 132 rather than being mated in the board loading direction 130 or at some mating angle transverse to the board loading direction 130 in the connector mating direction 132.

Figure 16:
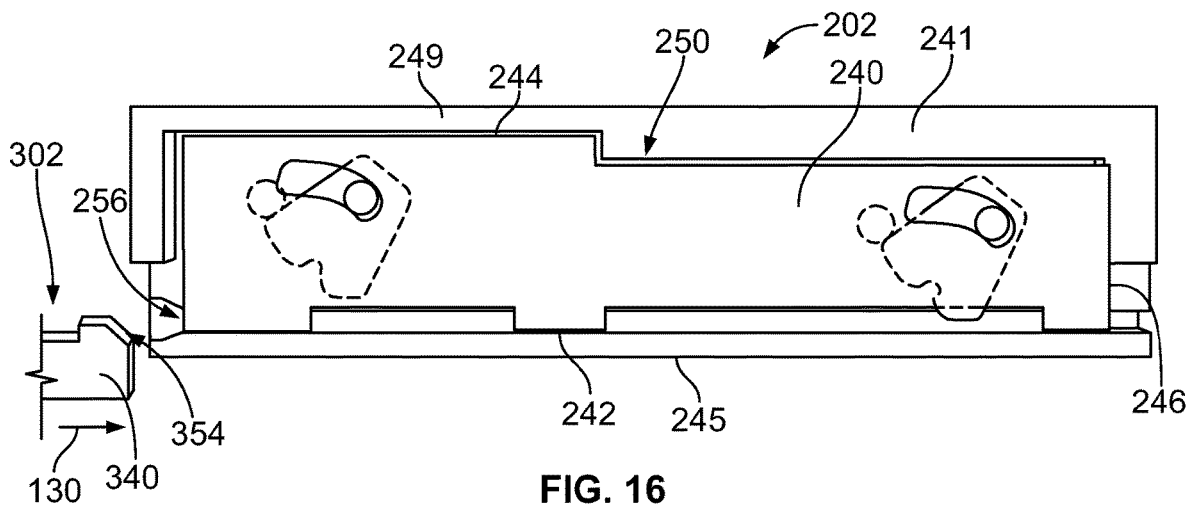
FIG. 16 illustrates a mating process of the first electrical connector with the second electrical connector, showing schematic views of the first electrical connector in accordance with an exemplary embodiment.

FIG. 16 is a schematic view of the first electrical connector 202 and the second electrical connector 302 during a mating operation. The first and second electrical connectors 202, 302 are shown unmated, immediately prior to the header housing 340 engaging the receptacle housing 241. The second electrical connector 302 is configured to be mated with the first electrical connector 202 in the board loading direction 130. The connecting element 354 of the header housing 340 is aligned with the guide slot 256 of the receptacle housing 241.

Prior to mating with the header housing 340, the mating housing 240 is located in the cavity 250 of the receptacle housing 241 at a normal or resting position. In the normal or resting position, the mating housing 240 is positioned generally forward and downward within the cavity 250. For example, the front 246 of the mating housing 240 may be located proximate to or abut against the front wall 245 of the receptacle housing 241. The second side 244 or top of the mating housing 240 is spaced apart from the top wall 249 of the receptacle housing 241 and the cavity 250 is oversized relative to the mating housing 240 to allow the mating housing 240 to move within the cavity 250. For example, the mating housing 240 is configured to move rearward and upward within the cavity 250 from the normal or resting position. In an exemplary embodiment, during mating of the second electrical connector 302 with the first electrical connector 202, the mating housing 240 is moved from the normal or resting position to a preloaded position that is rearward and upward relative to the normal or resting position.

Figure 17:
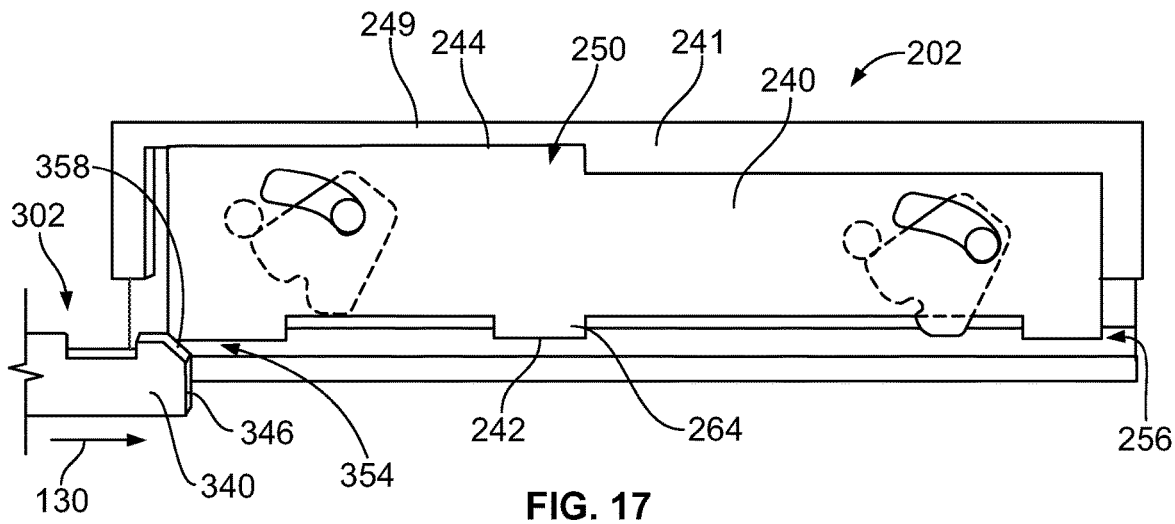
FIG. 17 illustrates a mating process of the first electrical connector with the second electrical connector, showing schematic views of the first electrical connector in accordance with an exemplary embodiment.

FIG. 17 is a schematic view of the first electrical connector 202 and the second electrical connector 302 during a mating operation. FIG. 17 illustrates the header housing 340 initially loaded into the receptacle housing 241. The connecting element 354 of the header housing 340 is received in the guide slot 256 of the receptacle housing 241 to guide mating in the board loading direction 130 (for example, forward direction). The header housing 340 interfaces with the mating housing 240. For example, the ramp 358 at the front 346 engages the bottom 242 of the mating housing 240. In an exemplary embodiment, the mating housing 240 includes one or more tabs 264 at the bottom 242. The ramp 358 engages the tab(s) 264 to lift the header housing 340 upward within the cavity 250. The header housing 340 moves the mating housing 240 toward a preloaded position. The first contacts 228 (removed for clarity) are moved with the mating housing 240 toward the preloaded position. In an exemplary embodiment, the top 244 of the mating housing 240 is moved proximate to or abuts against the top wall 249 of the receptacle housing 241 in the preloaded position.

Figure 18:
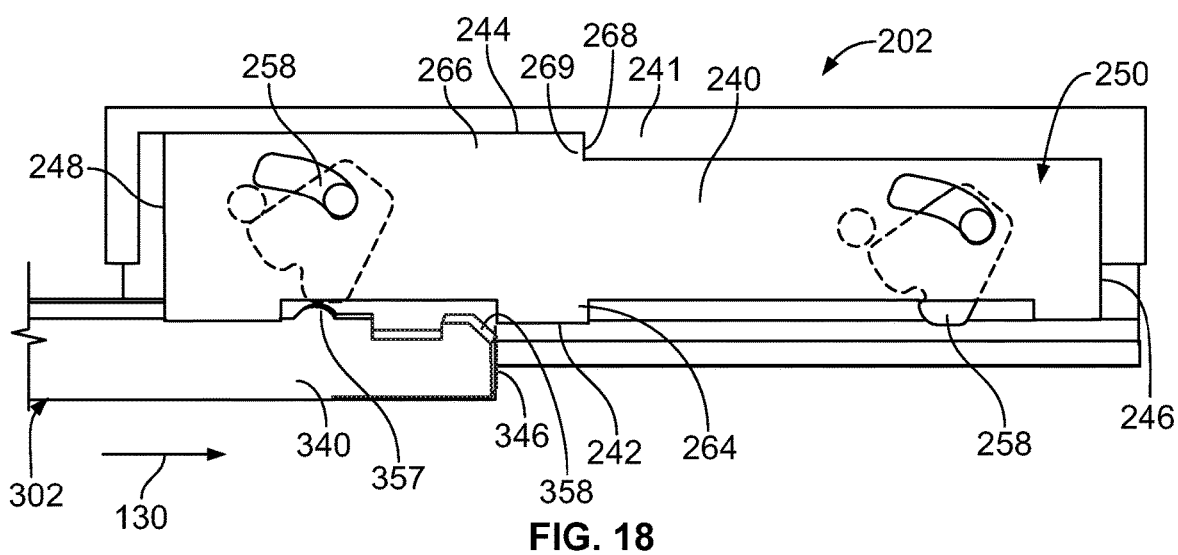
FIG. 18 illustrates a mating process of the first electrical connector with the second electrical connector, showing schematic views of the first electrical connector in accordance with an exemplary embodiment.

FIG. 18 is a schematic view of the first electrical connector 202 and the second electrical connector 302 during a mating operation. FIG. 18 illustrates the header housing 340 moved further in the board loading direction 130 into the receptacle housing 241. The tabs 264 of the mating housing 240 ride along the ramp 358 to maintain the mating housing 240 in the lifted or preloaded position.

In an exemplary embodiment, the forward and rearward cam levers 258 are at different vertical heights relative to the bottom 242 of the mating housing 240. For example, the rearward cam lever 258 closer to the rear 248 is elevated or higher than the forward cam lever 258 closer to the front 246. As such, the forward driving element 357 closer to the front 346 is able to bypass the rearward cam lever 258 without actuating the rearward cam lever 258. In an exemplary embodiment, the mating housing 240 includes a step 266 at the top 244 to accommodate the rearward cam lever 258 being at the elevated location. The step 266 includes a stop surface 268 configured to engage a shroud stop 269 of the receptacle housing 241. The shroud stop 269 locates the mating housing 240 within the shroud defining the cavity 250. The shroud stop 269 prevents the mating housing 240 from moving forward when the stop surface 268 engages the shroud stop 269.

Figure 19:
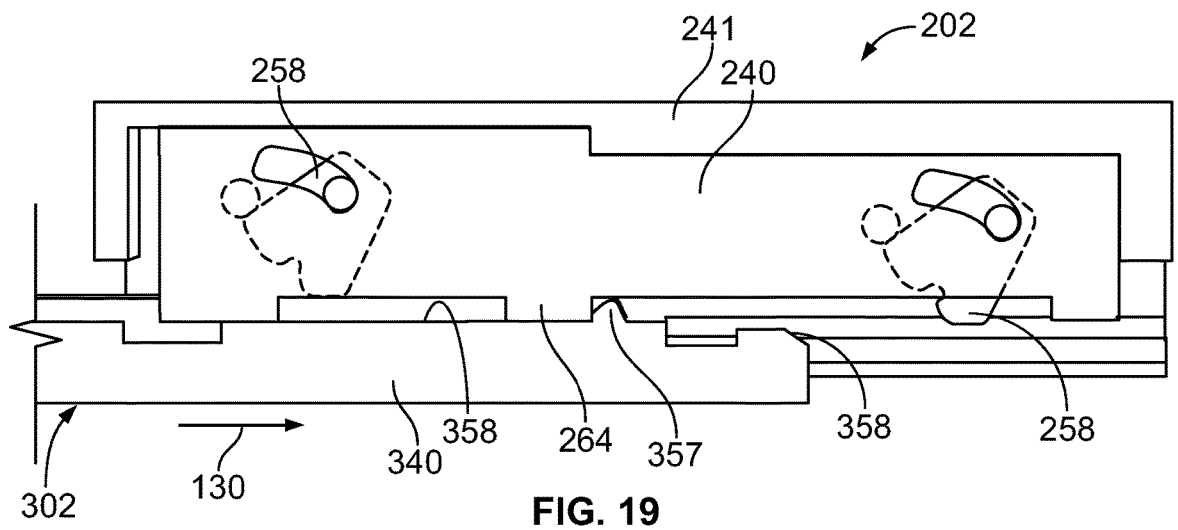
FIG. 19 illustrates a mating process of the first electrical connector with the second electrical connector, showing schematic views of the first electrical connector in accordance with an exemplary embodiment.

FIG. 19 is a schematic view of the first electrical connector 202 and the second electrical connector 302 during a mating operation. FIG. 19 illustrates the header housing 340 moved further in the board loading direction 130 into the receptacle housing 241. The tabs 264 of the mating housing 240 ride along the ramp 358 to maintain the mating housing 240 in the lifted or preloaded position. FIG. 19 illustrates the forward driving element 357 positioned forward of the rearward cam lever 258.

Figure 20:
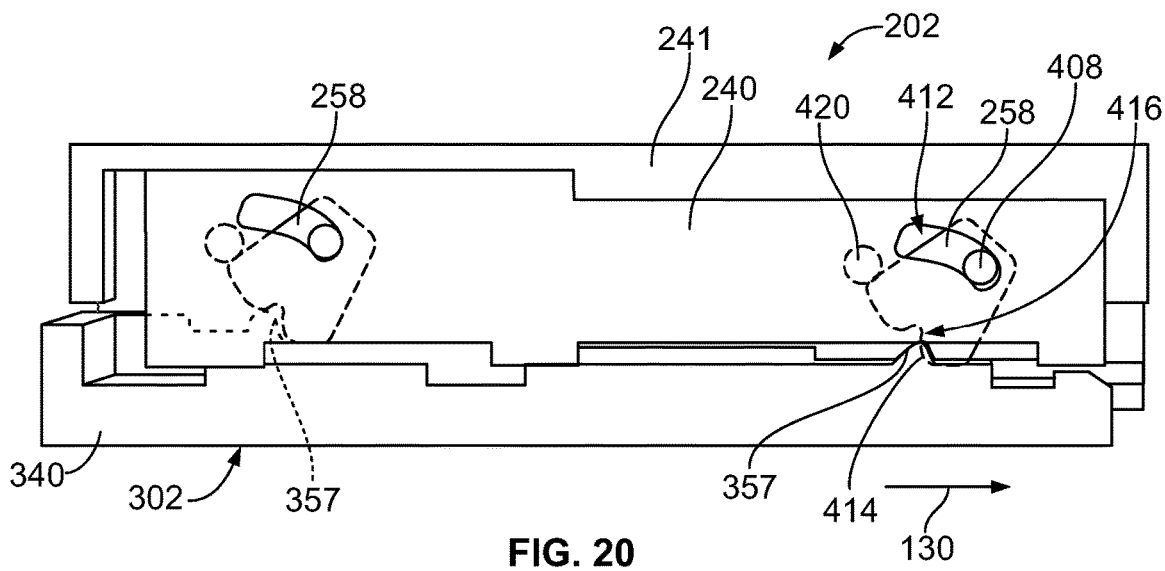
FIG. 20 illustrates a mating process of the first electrical connector with the second electrical connector, showing schematic views of the first electrical connector in accordance with an exemplary embodiment.

FIG. 20 is a schematic view of the first electrical connector 202 and the second electrical connector 302 during a mating operation. FIG. 20 illustrates the header housing 340 moved further in the board loading direction 130 into the receptacle housing 241. In an exemplary embodiment, the cam levers 258 engage cam stops 420 of the mating housing 240. The cam stops 420 position the cam levers 258 and prevent over rotation of the cam levers 258 in a clockwise and/or counterclockwise direction.

The cam levers 258 are operably coupled to the mating housing 240. The movable pivot 408 is received in the cam slot 412. The cam levers 258 are rotatably coupled to the receptacle housing 241. Rotation of the cam levers 258 causes movement of the movable pivot 408 in the cam slot 412, which is configured to move the mating housing 240 relative to the receptacle housing 241. During mating of the second electrical connector 302 with the first electrical connector 202, the driving elements 357 engage the cam levers 258. For example, the driving elements 357 are received in the pockets 416 and engage the cam surfaces 414. Further movement of the header housing 340 in the board loading direction 130 causes rotation of the cam levers 258.

Figure 21:
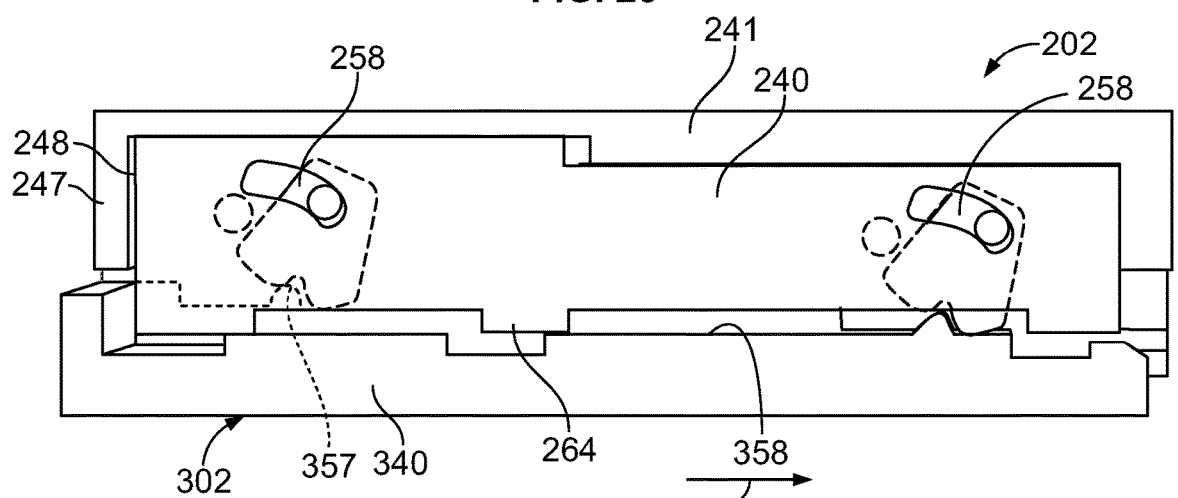
FIG. 21 illustrates a mating process of the first electrical connector with the second electrical connector, showing schematic views of the first electrical connector in accordance with an exemplary embodiment.
Figure 22:
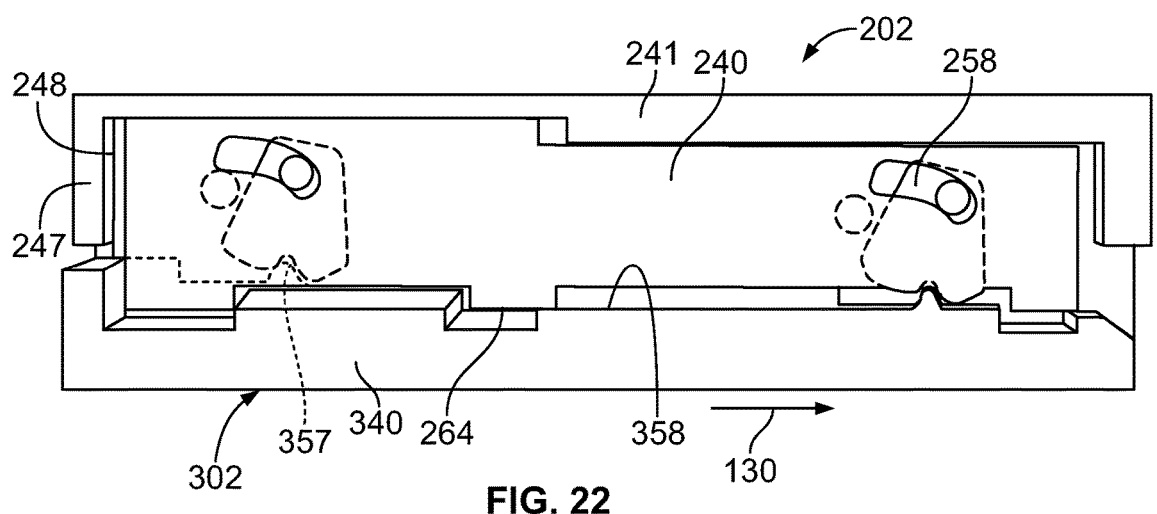
FIG. 22 illustrates a mating process of the first electrical connector with the second electrical connector, showing schematic views of the first electrical connector in accordance with an exemplary embodiment.

FIGS. 21 and 22 are schematic views of the first electrical connector 202 and the second electrical connector 302 during a mating operation. FIGS. 21 and 22 illustrate the header housing 340 causing rotation of the cam levers 258 and movement of the mating housing 240 relative to the receptacle housing 241. For example, rotation of the cam levers 258 causes movement of the mating housing 240 in a rearward direction.

During mating, the mating housing 240 is moved rearward in the receptacle housing 241 toward a preloaded position. The rear 248 of the mating housing 240 is moved toward the rear wall 247 of the receptacle housing 241. As the mating housing 240 is moved rearward, the tabs 264 of the mating housing 240 ride along the ramps 358 of the header housing 340 to maintain the mating housing 240 in the elevated or lifted position relative to the receptacle housing 241. As such, the first contacts 228 and the second contacts 328 (both removed for clarity) are free to move past each other into alignment as the second electrical connector 302 is moved in the board loading direction 130. The first contacts 228 are moved with the mating housing 240 in the rearward direction toward the preloaded position.

Figure 23:
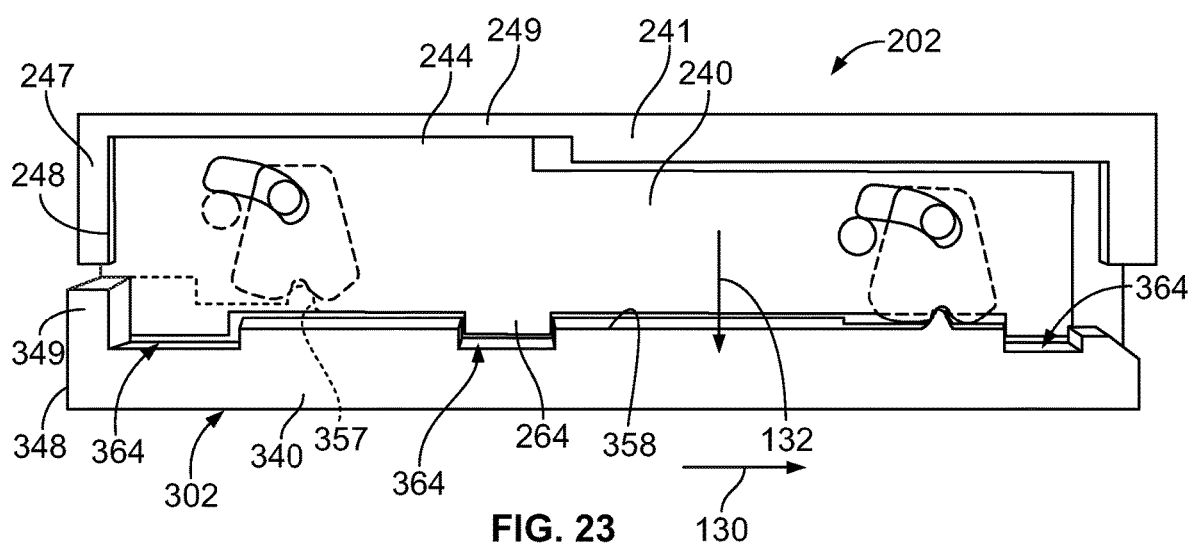
FIG. 23 illustrates a mating process of the first electrical connector with the second electrical connector, showing schematic views of the first electrical connector in accordance with an exemplary embodiment.

FIG. 23 is a schematic view of the first electrical connector 202 and the second electrical connector 302 during a mating operation. FIG. 23 illustrates the first electrical connector 202 in the preloaded position. FIG. 23 illustrates the mating housing 240 in a rearward and upward position within the receptacle housing 241 in the preloaded position. The top 244 of the mating housing 240 is proximate to or abuts against the top wall 249. The rear 248 is proximate to or abuts against the rear wall 247. In the preloaded position, the tabs 264 are aligned with channels 364 in the ramps 358. The channels 364 are wide enough to accommodate the tabs 264. For example, the mating housing 240 is able to move downward in the connector mating direction 132 from the preloaded position. At earlier positions (for example, see FIGS. 21 and 22), the tabs 264 are offset relative to the channels 364, thus blocking the mating housing 240 from moving in the connector mating direction 132.

In an exemplary embodiment, the header housing 340 includes a drive wall 349 configured to engage the mating housing 240 to cause synchronized movement of the mating housing 240 and the header housing 340 in the board loading direction 130. In various embodiments, the drive wall 349 is provided at the rear 348 of the header housing 340. The drive wall 349 is configured to engage the rear 248 of the mating housing 240. In an exemplary embodiment, the drive wall 349 engages the mating housing 240 in the preloaded position. When the drive wall 349 engages the mating housing 240, further movement of the header housing 340 in the board loading direction 130 causes corresponding movement of the mating housing 240 and the board loading direction 130. The header housing 340 no longer moves relative to the mating housing 240 in the board loading direction 130, rather the mating housing 240 moves with the header housing 340.

Figure 24:
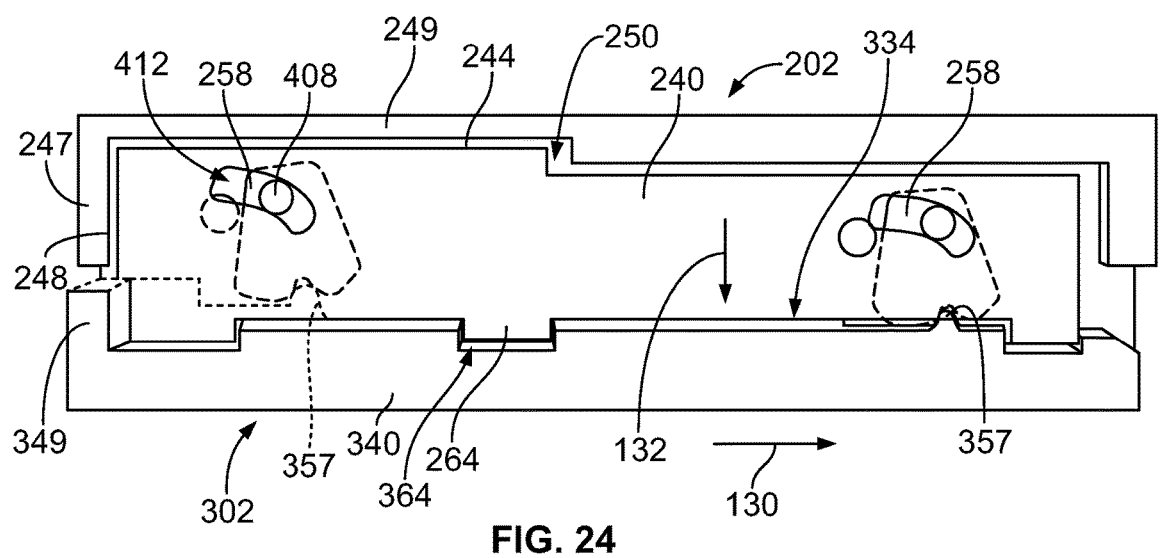
FIG. 24 illustrates a mating process of the first electrical connector with the second electrical connector, showing schematic views of the first electrical connector in accordance with an exemplary embodiment.
Figure 25:
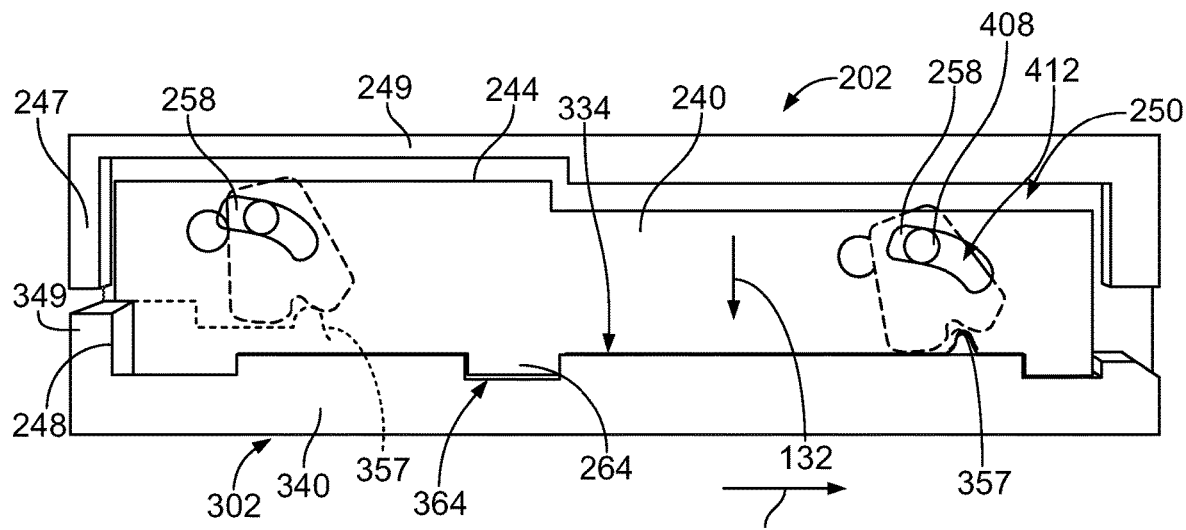
FIG. 25 illustrates a mating process of the first electrical connector with the second electrical connector, showing schematic views of the first electrical connector in accordance with an exemplary embodiment.

FIGS. 24 and 25 are schematic views of the first electrical connector 202 and the second electrical connector 302 during a mating operation. FIGS. 24 and 25 illustrate the first electrical connector 202 moved in the connector mating direction 132 to a partially mated position. The tabs 264 are shown partially loaded into the channel 364. As the second electrical connector 302 is moved in the board loading direction 130, the cam levers 258 are further rotated by the driving elements 357. The movable pivot 408 is moved in the cam slot 412. The arcuate or cammed shape of the cam slot 412 causes the cam lever 258 to convert rotational movement of the cam lever 258 into translational movement of the mating housing 240 in the connector mating direction 132. The first electrical connector 202 is electrically coupled to the second electrical connector 302 as the mating housing 240 is moved in the connector mating direction 132. For example, the first contacts 228 are mated with the second contacts 328 (both removed for clarity) as the mating housing 240 is moved in the connector mating direction 132.

In the partially mated position, the mating housing 240 is moved toward the mating end 334 of the second electrical connector 302. The mating housing 240 is moved within the cavity 250 such that the top 244 of the mating housing 240 is moved away from the top wall 249. In an exemplary embodiment, as the header housing 340 is moved in the board loading direction 130, the mating housing 240 is moved with the header housing 340 by the drive wall 349 such that the rear 248 of the mating housing 240 is moved away from the rear wall 247. During mating, the mating housing 240 is moved from the preloaded position (FIG. 23) in a forward and downward direction (for example, moved in both the board loading direction 130 and in the connector mating direction 132).

Figure 26:
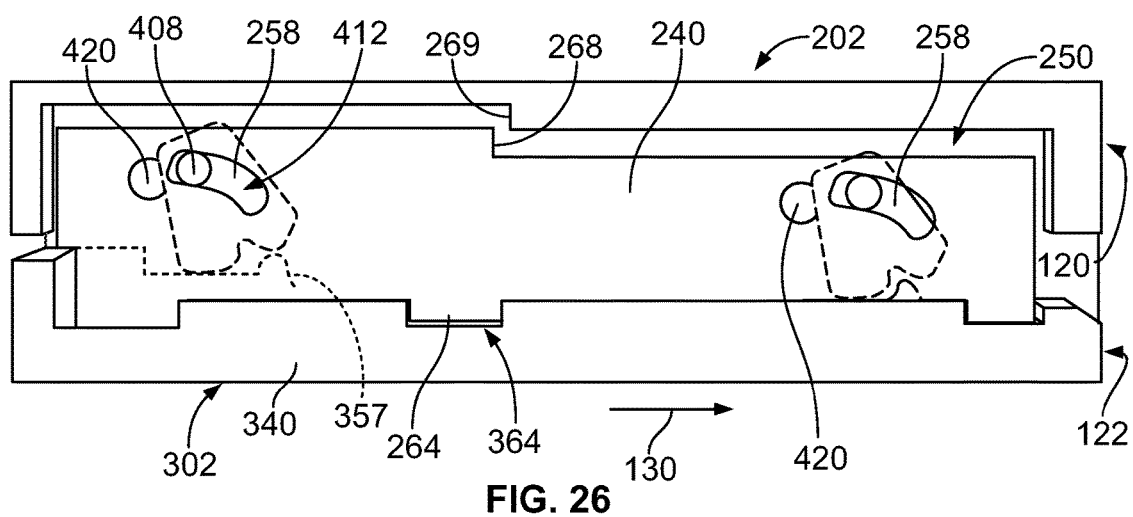
FIG. 26 illustrates a mating process of the first electrical connector with the second electrical connector, showing schematic views of the first electrical connector in accordance with an exemplary embodiment.

FIG. 26 is a schematic view of the first electrical connector 202 and the second electrical connector 302 during a mating operation. FIG. 26 illustrates the first electrical connector 202 in the mated position. The mating housing 240 is fully mated with the header housing 340. The first and second contacts 228, 328 (removed for clarity) are fully mated and electrically connected. In the mated position, the tabs 264 are loaded into the channel 364. In the mated position, the movable pivots 408 are positioned near the ends of the cam slots 412. In various embodiments, the cam slots 412 may include additional space for the movable pivots 408 to move beyond the mated position, such as to an over travel position. In an exemplary embodiment, the cam levers 258 engage the cam stops 420 and the cam stops 420 prevent further rotation of the cam levers 258.

Figure 27:
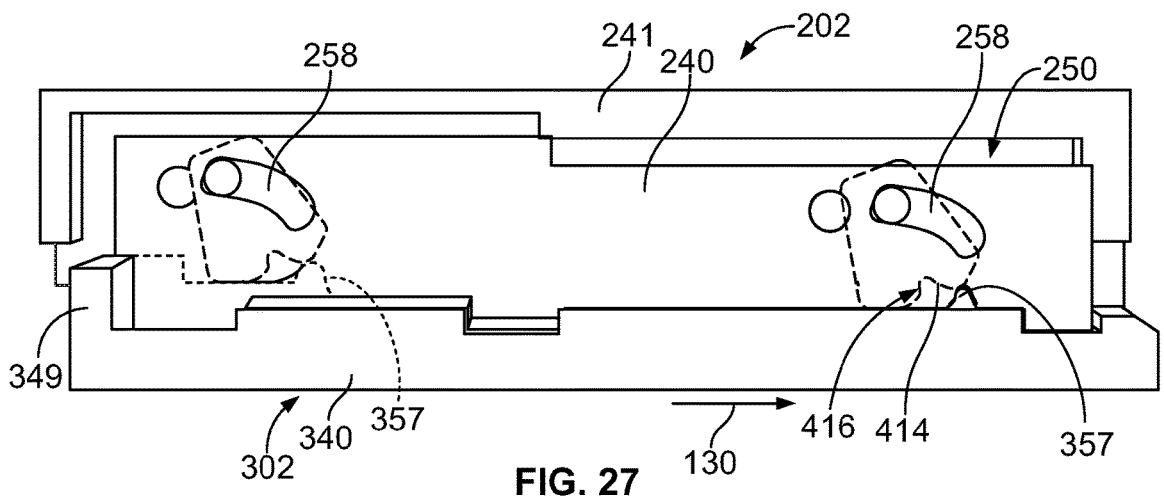
FIG. 27 illustrates a mating process of the first electrical connector with the second electrical connector, showing schematic views of the first electrical connector in accordance with an exemplary embodiment.

The mating housing 240 is moved from the preloaded position (FIG. 23) to the mated position (FIG. 26) in a forward and downward direction. The first contacts 228 are moved from the preloaded position to the mated position with the mating housing 240. For example, the flexible sections 290 of the first contacts 228 are flexed or preloaded from the normal or resting position (FIG. 16) to the preloaded position (FIG. 23) and are then moved (for example, unflexed) back to or toward the normal positions. For example, the mating housing 240 and the first contacts 228 may be in similar or the same positions at the normal or resting position (FIG. 16) and the mated position (FIG. 26). In an exemplary embodiment, the mating housing 240 is positioned in the cavity 250 such that the stop surface 268 is clear of the shroud stop 269 in the mated position. For example, the stop surface 268 may be below the shroud stop 269. As such, the mating housing 240 is capable of moving forward from the mated position within the cavity 250 without the shroud stop 269 blocking the stop surface 268. As such, the mating housing 240 is configured to move with the header housing 340 in the board loading direction 130 to an over mated position (FIG. 27). As such, the first electrical connector 202 provides mating tolerance for mating the first circuit card assembly 120 with the second circuit card assembly 122.

FIG. 27 is a schematic view of the first electrical connector 202 and the second electrical connector 302 during a mating operation. FIG. 27 illustrates the first electrical connector 202 in an over mated position. The mating housing 240 is movable within the cavity 250 of the receptacle housing 241 to the over mated position. The mating housing 240 is movable with the header housing 340 in the board loading direction 130 to the over mated position. For example, the drive wall 349 moves the mating housing 240 in the forward direction to the over mated position. In an exemplary embodiment, the mating housing 240 may be moved forward from the mated position to the over mated position by a distance of approximately 1.5 mm; however, the first electrical connector 202 may accommodate a longer range of over travel in alternative embodiments. In an exemplary embodiment, the driving elements 357 are released from the pockets 416 and the cam surfaces 414 such that movement of the header housing 340 in the board loading direction 130 between the mated position and the over mated position does not cause further rotation of the cam levers 258. The mating housing 240 does not move in the connector mating direction 132 as the mating housing 240 and the header housing 340 are moved in the board loading direction 130 from the mated position to the over mated position.

Figure 28:
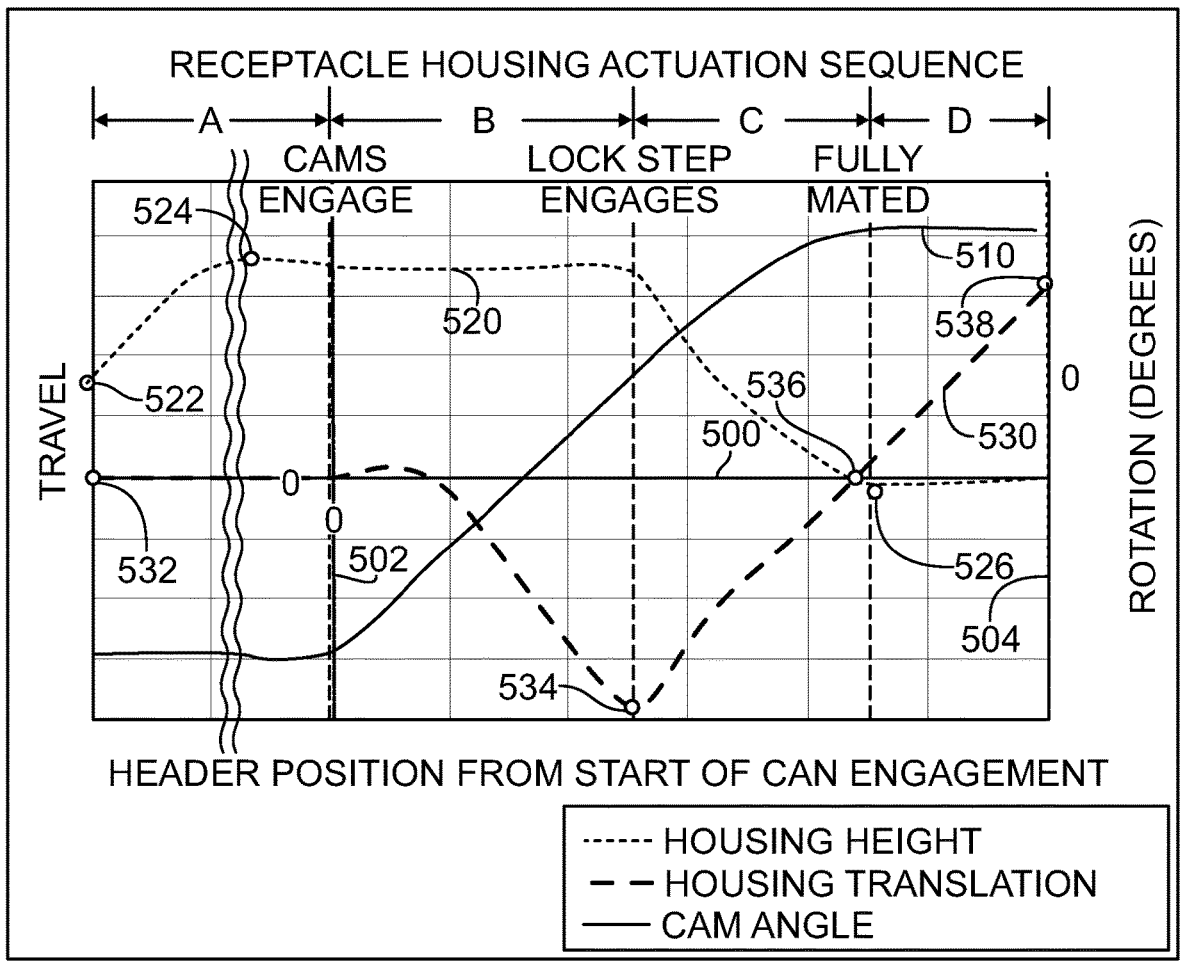
FIG. 28 is a graph showing the actuation sequence of the mating housing and the cam levers during the mating process in accordance with an exemplary embodiment.

FIG. 28 is a graph showing the actuation sequence of the mating housing 240 and the cam levers 258 during the mating process. The graph illustrates the actuation sequence during various stages A-D of the mating process. Stage A represents the header preloading process. Stage B represents the cam lever preloading process. Stage C represents the connector mating process. Stage D represents the over mating process. Stage A corresponds to FIGS. 16-20 and loading of the header housing 340 into the receptacle housing 241 prior to the cam levers 258 engaging the driving elements 357 with the header housing 340 preloading the mating housing 240 by elevating the mating housing 240 relative to the receptacle housing 241. Stage B corresponds to FIGS. 21-23 and actuation of the cam levers 258 by the driving elements 357 to preload the mating housing 240 relative to the receptacle housing 241. Stage C corresponds to FIGS. 24-26 and actuation of the cam levers 258 by the driving elements 357 to move the mating housing 240 in the connector mating direction 132. Stage D corresponds to FIG. 27 and over travel of the header housing 340 and the mating housing 240 relative to the receptacle housing 241.

Horizontal axis 500 represents horizontal travel (e.g., in millimeters) of the header housing 340 from a location corresponding to the start of the cam lever engagement (for example, the 0 position corresponds to the location between stage A and stage B). Vertical axis 502 represents travel (e.g., in millimeters) of the mating housing 240 relative to the receptacle housing 241. Vertical axis 504 identifies rotation (e.g., in degrees).

Line 510 corresponds to horizontal axis 500 and vertical axis 504 to represent rotation in degrees of the cam lever 258. Prior to cam lever engagement, in stage A, the cam lever 258 is at a negative rotation angle (e.g., between approximately −30° and −50°). After the driving element 357 engages the cam lever 258, the cam lever 258 is rotated until the mating housing 240 is fully mated with the header housing 340. When fully mated, the cam lever 258 is at a positive rotation angle (e.g., between approximately 15° and 45°). It is realized that the cam lever 258 may be at different angular positions in alternative embodiments. The rotation angle of the cam lever 258 changes during stage B and during stage C. Optionally, the rate of change may be generally constant through stage B and stage C. The driving element 357 is released from the cam lever 258 once fully mated such that further movement of the header housing 340 in the board loading direction 130 does not correspond to further rotation of the cam lever 258.

Line 520 corresponds to the horizontal axis 500 and the vertical axis 502. Line 520 represents the vertical height (in millimeters) of the mating housing 240 relative to the receptacle housing 241. The vertical height is defined relative to the mated position (for example, the vertical height is 0 in the mated position). A first position 522 of the mating housing 240 corresponds to the normal or resting position. In the normal or resting position, the mating housing 240 is at a first vertical height. In various embodiments, the first vertical height is a positive position. However, the mating housing 240 may be at approximately 0 mm or may be at a negative position in the normal or resting position. During stage A, as the header housing 340 is loaded into the receptacle housing 241, the header housing 340 engages the mating housing 240 and elevates or lifts the mating housing 240 to a second height 524, which is elevated relative to the first vertical height. The second height 524 corresponds to a vertical preloaded position for the mating housing 240. During stage B, the mating housing 240 remains at the second height 524 in the vertical preloaded position until the header housing 340 is loaded to the aligned position with the drive wall 349 engaging the mating housing 240 and the tabs 264 aligned with the channel 364. During stage C, as the drive wall 349 engages the mating housing 240, further rotation of the cam levers 258 causes the mating housing 240 to move downward to the mated position at a mated height 526. During stage D, the mating housing 240 remains at the mated height 526 as the mating housing 240 and the header housing 340 move to the over travel position.

Line 530 corresponds to the horizontal axis 500 and the vertical axis 502. Line 530 represents the horizontal translation (in millimeters) of the mating housing 240 relative to the receptacle housing 241. The horizontal translation is defined relative to the normal or resting position (for example, the horizontal translation is 0 in the normal or resting position). At stage A, prior to the driving elements 357 engaging the cam levers 258, the mating housing 240 remains at the normal or resting position 532. At stage B, the cam levers 258 move the mating housing 240 rearward to a second position 534, which is a negative position relative to the normal or resting position. At stage C, the drive wall 349 engages the mating housing 240, which causes the mating housing 240 to move in the forward direction with the header housing 340. At the mated position 536, the mating housing 240 may be moved forward in the receptacle housing 241 approximately back to the normal or resting position. At stage D, the header housing 340 continues to move the mating housing 240 in the forward direction to an over travel position 538, which is a positive position relative to the normal or resting position.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A communication system comprising:
a first circuit card assembly having a first printed circuit board (PCB) and a first electrical connector mounted to the first PCB, the first electrical connector having a first mating end and first contacts at the first mating end, each of the first contacts having a first mating interface, the first electrical connector having a receptacle housing and a mating housing received in the receptacle housing, the first electrical connector including cam levers coupled between the mating housing and the receptacle housing to move the mating housing relative to the receptacle housing; and
a second circuit card assembly having a second PCB and a second electrical connector mounted to the second PCB, the second electrical connector having a second mating end and second contacts at the second mating end, each of the second contacts having a second mating interface, the second mating end being mated to the first mating end to mate the second contacts and the first contacts, the second electrical connector having a header housing holding the second contacts, the second electrical connector including driving elements interfacing with the cam levers to actuate the mating housing relative to the receptacle housing;
wherein at least one of the first PCB and the second PCB includes a slot receiving the other of the first PCB and the second PCB in a board loading direction along a board loading axis;
wherein the header housing is coupled to the receptacle housing in the board loading direction as the first circuit card assembly and the second circuit card assembly are mated to interface the driving elements with the cam levers, the mating housing being movable away from the second mating end to a preloaded position by the driving elements and the mating housing being movable toward the second mating end to a mated position by the driving elements.

2. The communication system of claim 1, wherein the mating housing is movable relative to the receptacle housing to the preloaded position in a preload direction generally opposite the board loading direction.

3. The communication system of claim 1, wherein the mating housing is movable relative to the receptacle housing with the header housing in the board loading direction between the preloaded position and the mated position.

4. The communication system of claim 1, wherein the mating housing is movable relative to the receptacle housing with the header housing in the board loading direction from the mated position to an over mated position.

5. The communication system of claim 4, wherein the mating housing does not move toward or away from the second mating end as the mating housing moves from the mated position to the over mated position.

6. The communication system of claim 1, wherein the header housing includes ramps at the second mating end engaging the mating housing and driving the mating housing in a first direction toward the preloaded position.

7. The communication system of claim 6, wherein the driving elements engage the cam levers to drive the mating housing in a second direction toward the preloaded position, the second direction be nonparallel to the first direction.

8. The communication system of claim 1, wherein the ramps include channels, the mating housing including tabs engaging the ramps, the tabs being aligned with the channels to allow the mating housing to move toward the second mating end to the mated position.

9. The communication system of claim 1, wherein the mating housing includes cam slots, the cam levers including movable pivots movable in the cam slots.

10. The communication system of claim 1, wherein the mating housing includes cam stops, the cam levers engaging the cam stops to stop rotation of the cam levers relative to the mating housing.

11. The communication system of claim 1, wherein the receptacle housing includes a front wall, a rear wall, and a top wall, the front wall, the rear wall, and the top wall defining a cavity, the mating housing being received in the cavity, the mating housing being movable within the cavity in a forward direction toward the front wall, the mating housing being movable within the cavity in a rearward direction toward the rear wall, the mating housing being movable within the cavity in an upward direction toward the top wall, and the mating housing being movable within the cavity in a downward direction away from the top wall.

12. The communication system of claim 11, wherein the mating housing is movable upward and rearward to the preloaded position as the header housing is coupled to the receptacle housing in the board loading direction, the mating housing being movable downward and forward from the preloaded position to the mated position as the header housing is coupled to the receptacle housing in the board loading direction.

13. The communication system of claim 1, wherein each cam lever includes a main body having a first side and a second side, the cam lever having a fixed pivot extending from the first side being received in an opening in the receptacle housing, the cam lever having a movable pivot extending from the second side being received in a cam slot in the mating housing.

14. A communication system comprising:
a first circuit card assembly having a first printed circuit board (PCB) and a first electrical connector mounted to the first PCB, the first electrical connector having a first mating end and first contacts at the first mating end, each of the first contacts having a first mating interface, the first electrical connector having a receptacle housing, the receptacle housing including a front wall and a rear wall, the receptacle housing including a top wall, the receptacle housing having a cavity defined by the front wall, the rear wall and the top wall, the first mating end provided at a bottom of the receptacle housing opposite the top wall, the first electrical connector including a mating housing received in the cavity of the receptacle housing, the first electrical connector including cam levers coupled between the mating housing and the receptacle housing, the cam levers configured to move the mating housing in the cavity relative to the receptacle housing; and
a second circuit card assembly having a second PCB and a second electrical connector mounted to the second PCB, the second electrical connector having a second mating end and second contacts at the second mating end, each of the second contacts having a second mating interface, the second mating end being mated to the first mating end to mate the second contacts and the first contacts, the second electrical connector having a header housing holding the second contacts, the header housing having a front and a rear, the header housing having a top and a bottom, the second mating end provided at the top of the header housing, second electrical connector including driving elements interfacing with the cam levers to actuate the mating housing relative to the receptacle housing;

wherein at least one of the first PCB and the second PCB includes a slot receiving the other of the first PCB and the second PCB in a board loading direction along a board loading axis, the board loading direction being parallel to the bottom of the receptacle housing;

wherein the header housing is coupled to the receptacle housing in the board loading direction as the first circuit card assembly and the second circuit card assembly are mated to interface the driving elements with the cam levers, wherein the mating housing is movable upward and rearward within the cavity to a preloaded position by the header housing as the header housing is coupled to the receptacle housing in the board loading direction, and wherein the mating housing is movable downward toward the header housing to a mated position by the driving elements as the header housing is coupled to the receptacle housing in the board loading direction.

15. The communication system of claim 14, wherein the mating housing is movable relative to the receptacle housing to the preloaded position in a preload direction generally opposite the board loading direction, wherein the mating housing is movable relative to the receptacle housing with the header housing in the board loading direction between the preloaded position and the mated position, and wherein the mating housing is movable relative to the receptacle housing with the header housing in the board loading direction from the mated position to an over mated position, the mating housing does not move toward or away from the second mating end as the mating housing moves from the mated position to the over mated position.

16. The communication system of claim 14, wherein the header housing includes ramps at the second mating end engaging the mating housing and driving the mating housing in a first direction toward the preloaded position, the driving elements engaging the cam levers to drive the mating housing in a second direction toward the preloaded position, the second direction be nonparallel to the first direction.

17. The communication system of claim 14, wherein the receptacle housing includes a front wall, a rear wall, and a top wall, the front wall, the rear wall, and the top wall defining a cavity, the mating housing being received in the cavity, the mating housing being movable within the cavity in a forward direction toward the front wall, the mating housing being movable within the cavity in a rearward direction toward the rear wall, the mating housing being movable within the cavity in an upward direction toward the top wall, and the mating housing being movable within the cavity in a downward direction away from the top wall.

18. A circuit card assembly for a communication system comprising:
a printed circuit board (PCB) having a first surface and a second surface and a mating edge between the first and second surfaces, the PCB having a slot extending inward from the mating edge configured to receive a second PCB of a second circuit card assembly in a board loading direction perpendicular to the mating edge, the PCB having a mounting area on the first surface adjacent the slot; and an electrical connector mounted to the first surface at the mounting area configured for mating with a second circuit card assembly, the electrical connector having a receptacle housing and a mating housing received in the receptacle housing and being movable relative to the receptacle housing, the electrical connector extending between a front and a rear, the electrical connector having a mounting end extending between the front and the rear being mounted to the mounting area, the electrical connector having a mating end extending between the front and the rear configured to be mated to the second electrical connector, the electrical connector having contacts held by the mating housing and being movable relative to the receptacle housing with the mating housing, the electrical connector including cam levers coupled between the mating housing and the receptacle housing to move the mating housing relative to the receptacle housing;

wherein the receptacle housing is configured to be coupled to the second circuit card assembly in the board loading direction as the circuit card assembly and the second circuit card assembly are mated to actuate the cam levers, the mating housing being initially movable away from the mating end to a preloaded position by driving elements and the mating housing being subsequently movable toward the mating end to a mated position by the driving elements.

19. The circuit card assembly of claim 18, wherein the mating housing is movable relative to the receptacle housing to the preloaded position in a preload direction generally opposite the board loading direction, wherein the mating housing is movable relative to the receptacle housing with the header housing in the board loading direction between the preloaded position and the mated position, and wherein the mating housing is movable relative to the receptacle housing with the header housing in the board loading direction from the mated position to an over mated position, the mating housing does not move toward or away from the second mating end as the mating housing moves from the mated position to the over mated position.

20. The circuit card assembly of claim 18, wherein the receptacle housing includes a front wall, a rear wall, and a top wall, the front wall, the rear wall, and the top wall defining a cavity, the mating housing being received in the cavity, the mating housing being movable within the cavity in a forward direction toward the front wall, the mating housing being movable within the cavity in a rearward direction toward the rear wall, the mating housing being movable within the cavity in an upward direction toward the top wall, and the mating housing being movable within the cavity in a downward direction away from the top wall.

* * * * *